US012542254B2

(12) United States Patent
Yang et al.

(10) Patent No.: US 12,542,254 B2

(45) Date of Patent: Feb. 3, 2026

(54) GRID STRUCTURES OF ION BEAM ETCHING (IBE) SYSTEMS

(71) Applicant: Taiwan Semiconductor Manufacturing Company, Ltd., Hsinchu (TW)

(72) Inventors: Chansyun David Yang, Shinchu (TW); Keh-Jeng Chang, Hsinchu (TW); Chan-Lon Yang, Taipei (TW); Perng-Fei Yuh, Walnut Creek, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/605,282

(22) Filed: Mar. 14, 2024

(65) Prior Publication Data

US 2024/0222071 A1 Jul. 4, 2024

Related U.S. Application Data

(63) Continuation of application No. 17/245,724, filed on Apr. 30, 2021, now Pat. No. 11,961,706.

(51) Int. Cl.

*H01J 37/08* (2006.01)

*H01J 37/305* (2006.01)

(52) U.S. Cl.

CPC .......... *H01J 37/3053* (2013.01); *H01J 37/08* (2013.01); *H01J 2237/1506* (2013.01); *H01J 2237/20214* (2013.01); *H01J 2237/3151* (2013.01)

(58) Field of Classification Search

CPC .................. H01J 37/3053; H01J 37/08; H01J 2237/1506; H01J 2237/20214; H01J 2237/3151

See application file for complete search history.

(56) References Cited

U.S. PATENT DOCUMENTS

2022/0351939 A1 11/2022 Yang et al.

FOREIGN PATENT DOCUMENTS

| | | | | |
|---|---|---|---|---|
| CN | 104454417 A | * | 3/2015 | |
| CN | 104484417 A | * | 4/2015 | ......... G06F 16/9562 |
| JP | 2021018984 A | * | 2/2021 | |

* cited by examiner

*Primary Examiner* — Henry Luong

(74) *Attorney, Agent, or Firm* — Sterne, Kessler, Goldstein & Fox P.L.L.C.

(57) ABSTRACT

The present disclosure relates to an ion beam etching (IBE) system including a plasma chamber configured to provide plasma, a screen grid, an extraction grid, an accelerator grid, and a decelerator grid. The screen grid receives a screen grid voltage to extract ions from the plasma within the plasma chamber to form an ion beam through a hole. The extraction grid receives an extraction grid voltage, where a voltage difference between the screen grid voltage and the extraction grid voltage determines an ion current density of the ion beam. The accelerator grid receives an accelerator grid voltage. A voltage difference between the extraction grid voltage and the accelerator grid voltage determines an ion beam energy for the ion beam. The IBE system can further includes a deflector system having a first deflector plate and a second deflector plate around a hole to control the direction of the ion beam.

20 Claims, 21 Drawing Sheets

GRID STRUCTURES OF ION BEAM ETCHING (IBE) SYSTEMS

CROSS-REFERENCE TO RELATED APPLICATION

This application is a continuation of U.S. patent application Ser. No. 17/245,724, titled "Grid Structures of Ion Beam Etching (IBE) Systems," filed Apr. 30, 2021, which is incorporated herein by reference in its entirety.

BACKGROUND

With advances in semiconductor technology, there has been an increasing demand for higher storage capacity, faster processing systems, higher performance, and lower costs. To meet these demands, the semiconductor industry continues to scale down the dimensions of semiconductor devices. Such scaling down has increased the complexity of semiconductor manufacturing processes and the demands for the precision of features in semiconductor manufacturing systems.

BRIEF DESCRIPTION OF THE DRAWINGS

Aspects of this disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1A:
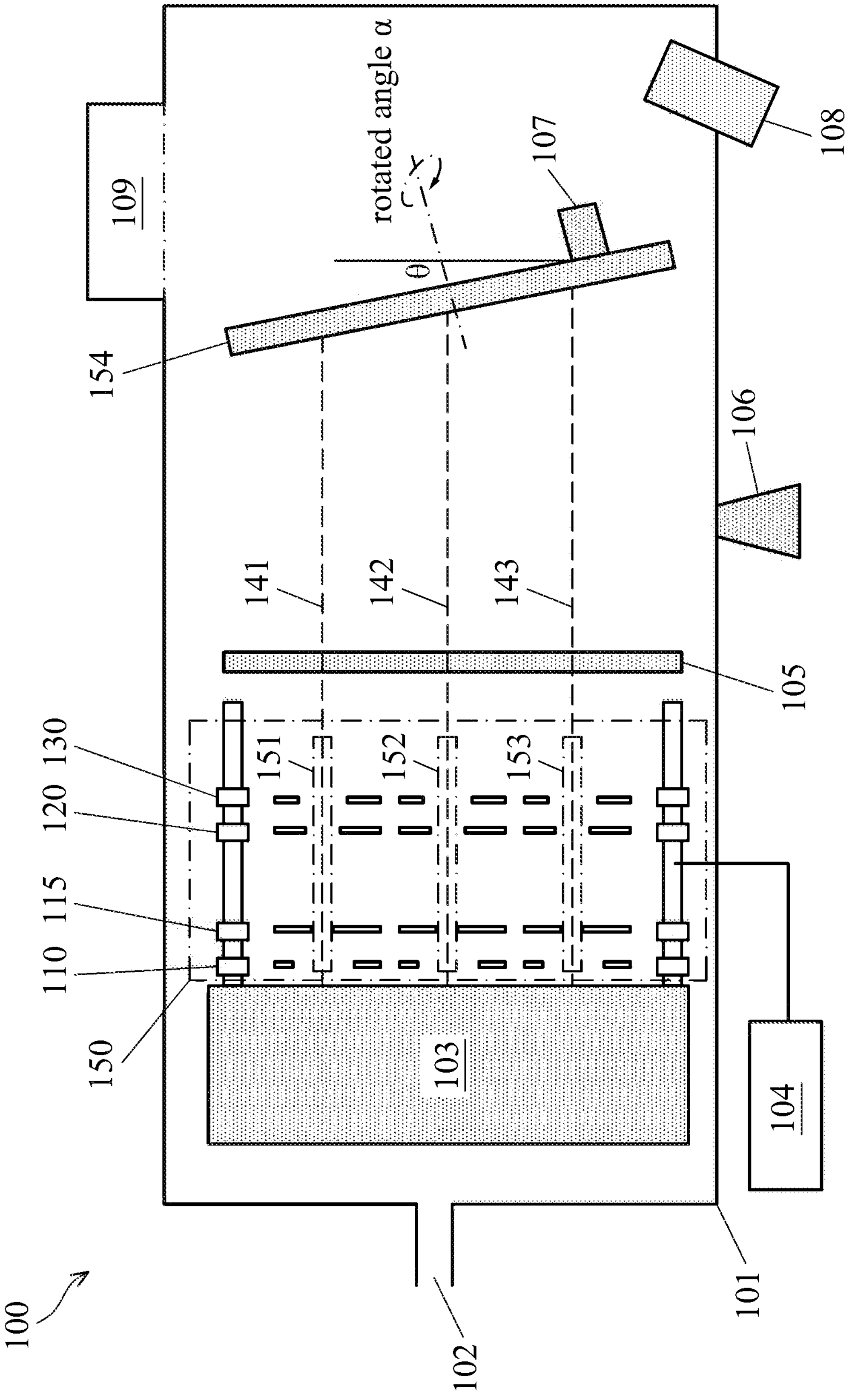
FIGS. 1A-1B and 1D illustrate cross-sectional views of portions of an ion beam etching (IBE) system with four grids, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

Ion beam etching (IBE) is a process that utilizes an inert gas plasma to bombard an etching target (e.g., a wafer) with ions to remove materials from the wafer. An IBE system includes a plasma chamber and a multi-grid system which is an optics system. Current IBE systems include a three-grid system having three grids. The three-grid system has numerous electrostatic apertures (holes) separated from each other, e.g., sometimes by a few millimeters. Applying specific voltages to each grid, the three-grid system controls the holes and ion beams through the holes. In detail, the three-grid system extracts positively charged ions from inductively coupled plasma (ICP, also referred to as inductively coupled discharge plasma) generated in the plasma chamber. In addition, the three-grid system further accelerates and directs the ions through the holes to form mono-energetic beams of the ions, or ion beams, to etch materials by physical sputtering on the wafer. Controlled by the three-grid system, an individual ion beam is created through each hole. The combination of the ion beams controlled by the three-grid system form a single broad beam to bombard the etching target. In an IBE process, an etching target (e.g., a wafer) can be placed with a tilted angle and/or a rotated angle to allow an angle of incidence of the ions onto the surface of the wafer. Such control of the ion incidence on the wafer affects sputtering yield and the resulting topography, hence substantially improving etching profiles of the etching target.

Accordingly, an IBE process can provide directional flexibility that is not available in other plasma processes. An IBE system can perform a directional etching process to create a feature (e.g., an opening) on a photoresist layer or a physical layer of a wafer, where the opening can have different lengths in different dimensions. For example, an IBE system can expand a square opening with a critical dimension (CD) to be larger in one dimension along an X-axis without changing a dimension along a Y-axis. As a result, the IBE process can compensate the extreme ultraviolet (EUV) lithography resolution limitation at small critical dimension patterning. While the etching rate with the IBE process is typically lower than the etching rate for a reactive ion etching (RIE) process, the IBE process can offer a high precision for applications that demand high dimension profile control. Also, the IBE process can be used to remove materials where an RIE process may not be successful. The IBE process can etch alloys and composite materials that are not compatible with an RIE process.

One of the challenges of the IBE process can be preventing asymmetry etching. When a wafer is placed within a process chamber of an IBE system with a tilted angle and/or rotated angle, different ion beams through the holes of the three-grid system have different incidence distances to the wafer. An incidence distance of an ion beam to the wafer is a distance from the source of the ion, or simply referred to as an ion source, to a location of the wafer, where the location is an incidence point of the ion beam on the surface of the wafer. Therefore, ions in different ion beams travel different incidence distances to reach the different locations of the wafer surface, resulting in different etching rates at different locations of the wafer surface. The etching rate at a first location of the tilted wafer by a first ion beam is lower when an incidence distance of the first ion beam is longer, while the etching rate at a second location of the tilted wafer by a second ion beam is higher when an incidence distance of the second ion beam is shorter. As a result, the etching amount at the first location is smaller than the etching amount at the second location, resulting in an asymmetry etching behavior for the IBE process. In general, the etching rate at a location of a tilted wafer surface is inversely proportional to an incidence distance of the corresponding ion beam incidence to the location. Rotation of the tilted wafer does not overcome the challenges of preventing asymmetry etching.

In an IBE system, the three-grid system includes a screen grid, an accelerator grid, and a decelerator grid to control the ion beams to strike the wafer. The screen grid, the accelerator grid, or the decelerator grid, includes elements, such as screen grid elements, accelerator grid elements, and decelerator grid elements. A screen grid element, an accelerator grid element, and a decelerator grid element together control a hole and an ion beam through the hole. All the screen grid elements are supplied by a screen voltage, all the accelerator grid elements are supplied by an accelerator voltage, and all the decelerator grid elements are supplied by a decelerator voltage. Therefore, all the ion beams of the IBE systems are controlled by electric fields of the same energy. Under the same energy, when ions in two different ion beams go through two different incidence distances to reach two locations of the wafer surface, two different etching rates are resulted at the two locations.

The present disclosure provides example IBE systems that can generate substantially uniformly etching across different locations of a surface of a tilted wafer within the process chamber of the IBE systems. In some embodiments, an IBE system can include at least a four-grid system with a screen grid having screen grid elements, an extraction grid having extraction grid elements, an accelerator grid having accelerator grid elements, and a decelerator grid having decelerator grid elements. A screen grid element, an extraction grid element, an accelerator grid element, and a decelerator grid element can form a hole that extends through the screen grid, the extraction grid, the accelerator grid, and the decelerator grid. The screen grid receives a screen grid voltage to extract ions from the plasma within the plasma chamber to form an ion beam through the hole. The extraction grid receives an extraction grid voltage, where a voltage difference between the screen grid voltage and the extraction grid voltage determines an ion current density of the ion beam through the hole. The accelerator grid receives an accelerator grid voltage, where a voltage difference between the extraction grid voltage and the accelerator grid voltage determines an ion beam energy of the ion beam through the hole. The decelerator grid receives a decelerator grid voltage. The addition of the extraction grid can provide additional control to the ion beam energy for the ion beam through the hole, reducing the asymmetry etching of the etching target, e.g., a wafer.

In some embodiments, in addition to a four-grid system, an IBE system can include a deflector system having deflector plates, where the deflector system can be counted as a fifth grid. A first deflector plate and a second deflector plate can be separated by a gap and disposed around a hole through the screen grid, the extraction grid, the accelerator grid, and the decelerator grid. The first deflector plate can receive a first deflector voltage, and the second deflector plate can receive a second deflector voltage, where a voltage difference between the first deflector voltage and the second deflector voltage can determine a trajectory of the ion beam through the hole and the gap between the first deflector plate and the second deflector plate. The trajectory of the ion beam can include a tilt angle of the ion beam to reach a wafer surface to perform directional etching of the wafer. The addition of the deflector system can provide additional control and precision to the ion beam direction through the hole to reach the wafer, reducing the asymmetry etching of the etching target, e.g., a wafer.

In some embodiments, the voltages supplied to the accelerator grid elements or the deflector plates around different holes can be varied to control different ion beams. Instead of having a same voltage supplied to different accelerator grid elements, some embodiments have different voltages supplied to different accelerator grid elements. Accordingly, the voltages for accelerator grid elements and deflector plates can balance all locations in the rotated tilted wafer with equal directional etching. As a result, embodiments herein reduce IBE asymmetry etching behavior. A tilted wafer has uniform etching across different locations of a surface of the tilted wafer when an etching amount at a first location is substantially same as an etching amount at a second location, where the first location and the second location can be any location of the surface of the tilted wafer.

Figure 1B:
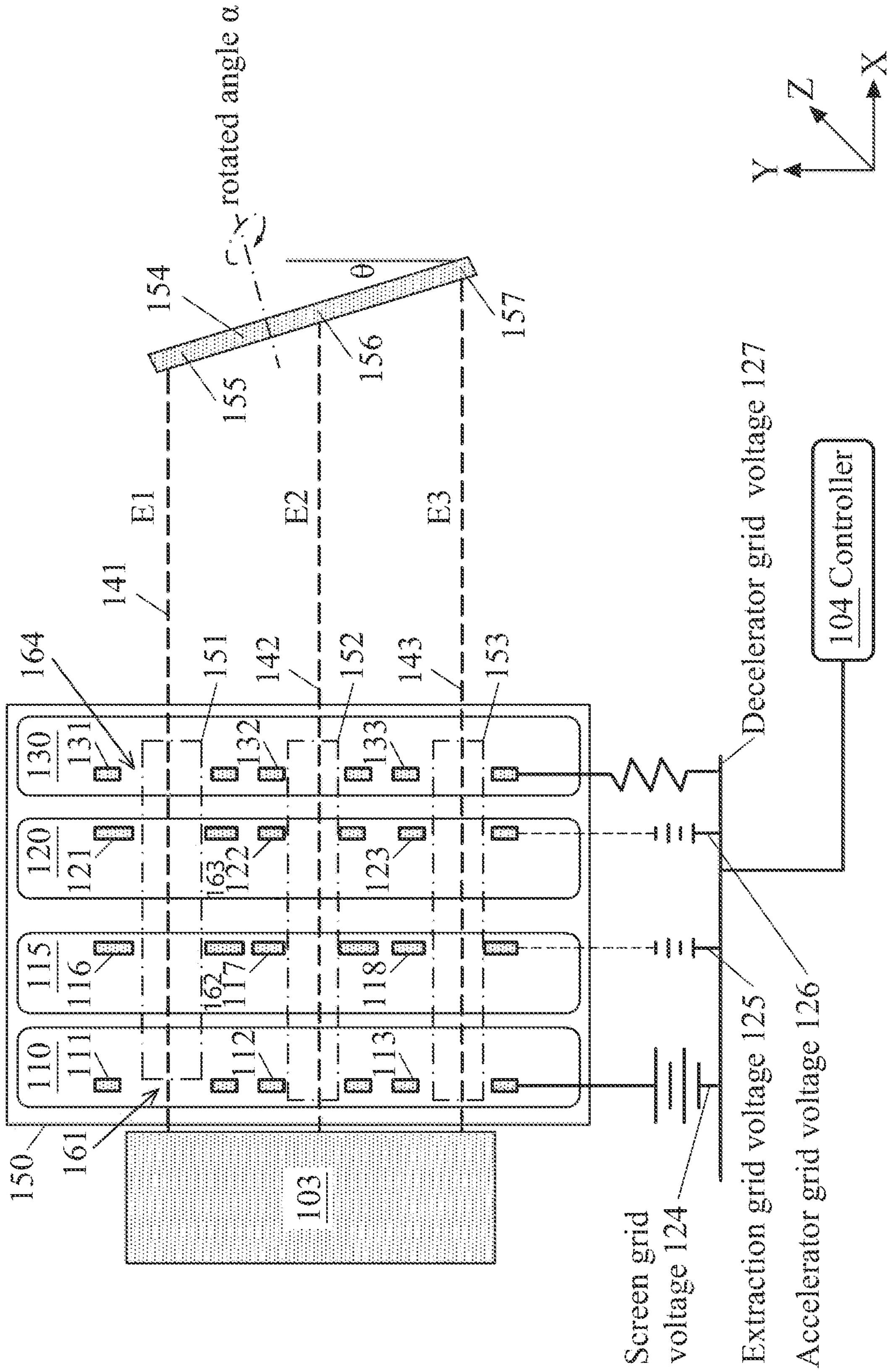
Figure 1C:
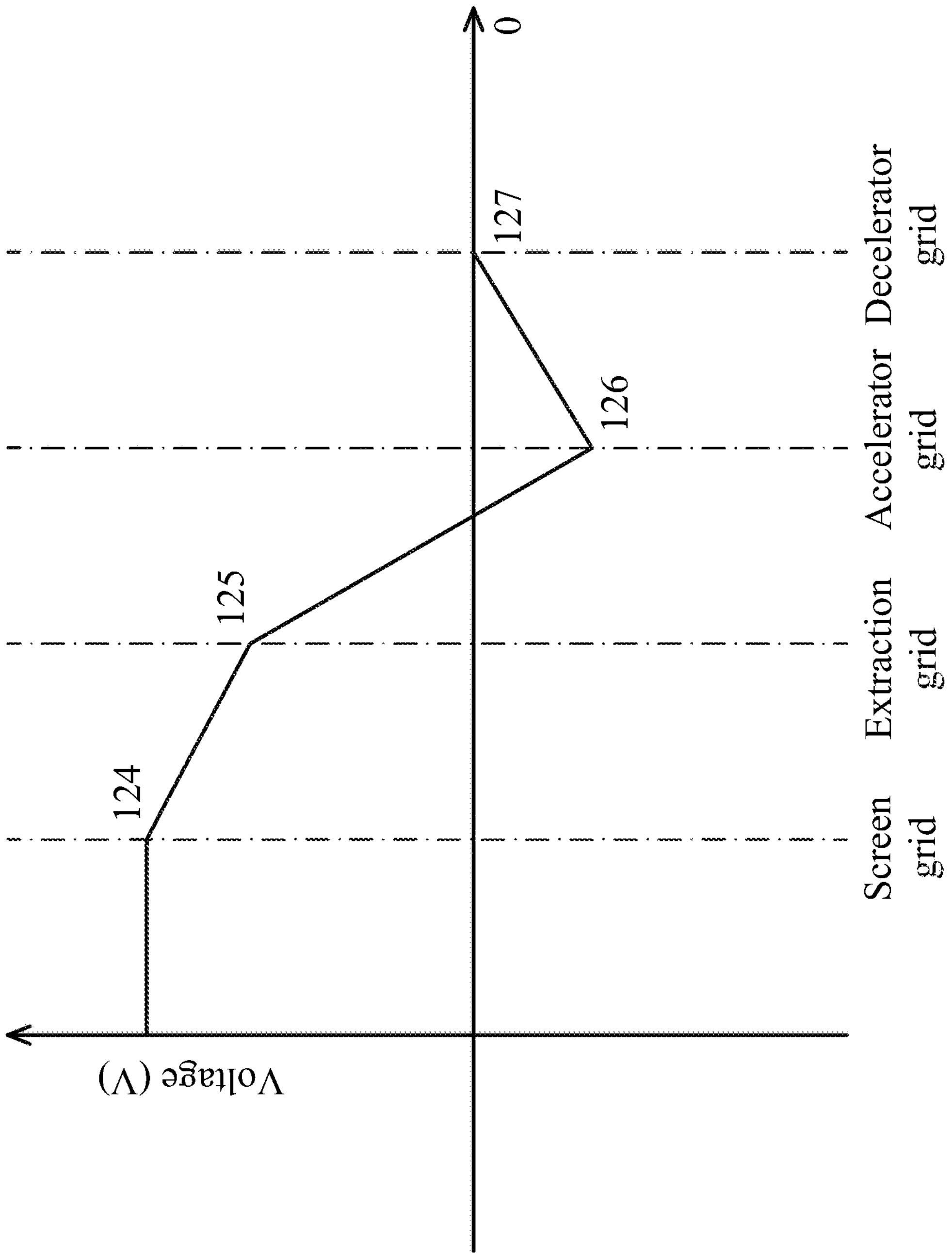
FIG. 1C illustrates voltages across different grids of an ion beam etching (IBE) system, in accordance with some embodiments.
Figure 1D:
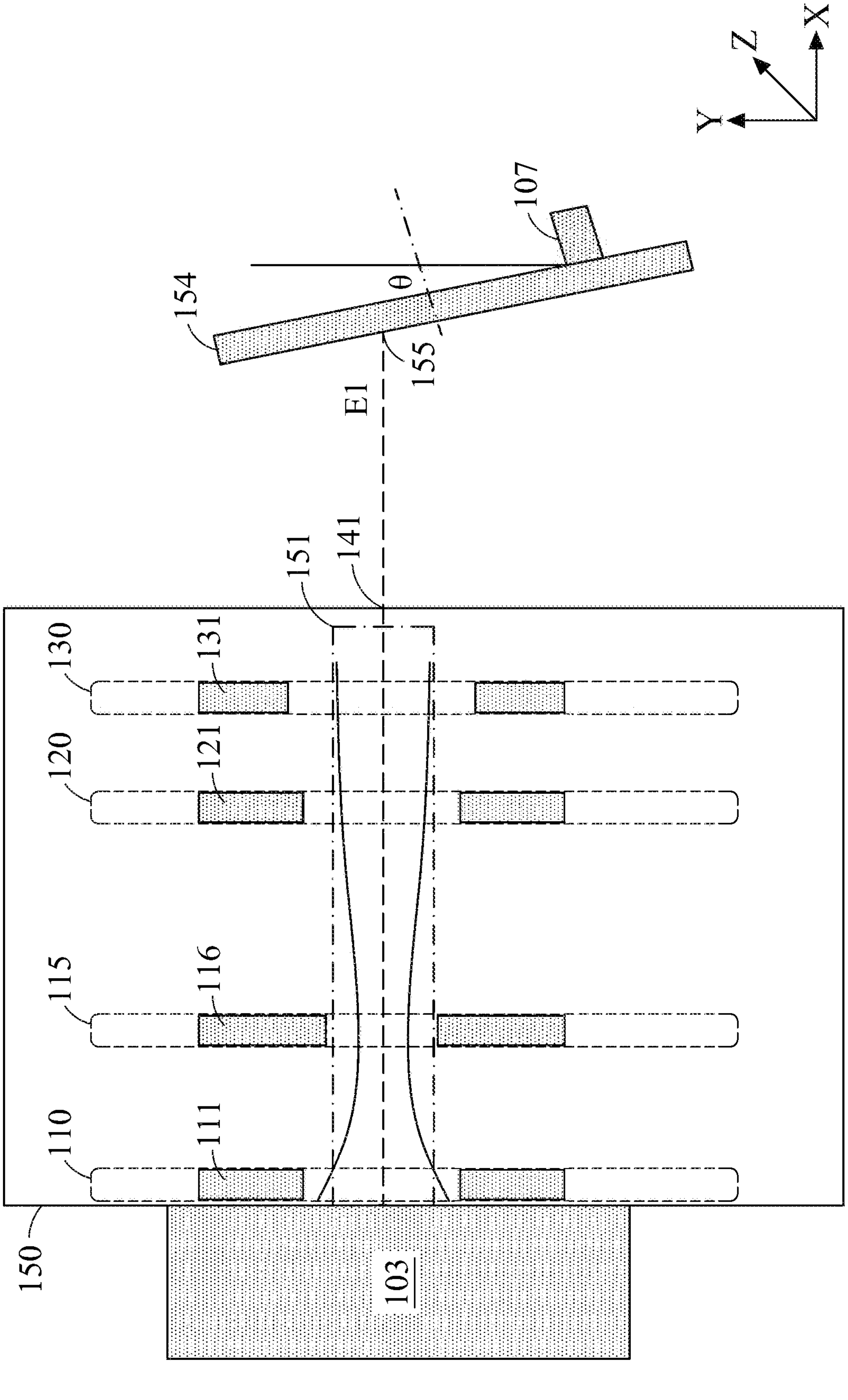

FIGS. 1A-1B and 1D illustrate cross-sectional views of portions of an IBE system 100 with four grids including a screen grid 110, an extraction grid 115, an accelerator grid 120, and a decelerator grid 130, in accordance with some embodiments. FIG. 1C illustrates voltages across screen grid 110, extraction grid 115, accelerator grid 120, and decelerator grid 130. FIGS. 1E-1J illustrate cross-sectional views of portions of IBE system 100 with five grids including screen grid 110, extraction grid 115, accelerator grid 120, decelerator grid 130, a deflector system 134, or a deflector system 137, in accordance with some embodiments.

In some embodiments, as shown in FIG. 1A, IBE system 100 can include a process chamber 101 having an inlet 102 to receive an inert gas, such as a noble gas. Process chamber 101 can include a plasma chamber 103 configured to provide plasma, and a grid system 150 including screen grid 110, extraction grid 115, accelerator grid 120, and decelerator grid 130. Holes are disposed in grid system 150, such as a hole 151, a hole 152, and a hole 153, with more details shown in FIG. 1B. Ions generated from the plasma within plasma chamber 103 go through the holes to form ion beams, such as an ion beam 141, an ion beam 142, and an ion beam 143. In addition, process chamber 101 can include a control unit 104, a mechanical shutter 105, a plasma bridge neutralizer 106, a rotating fixture 107 configured to hold a wafer 154, a secondary ions mass spectrometer 108, and a pump 109 to pre-pump and exhaust process chamber 101. Wafer 154 can have a tilted angle θ with respect to a first direction (e.g., along a Y-axis) and a rotated angle α with respect to a second direction (e.g., along a Z-axis). Rotating fixture 107 can rotate wafer 154. In some embodiments, ion beam 141, ion beam 142, and ion beam 143 can reach wafer 154 along a third direction (e.g., along an X-axis).

IBE system 100 can use an inert gas (e.g., argon or a noble gas) received from inlet 102 to generate ICP in plasma chamber 103. In addition, being electrically biased, grid system 150 can extract positively charged ions from the ICP and provide ions as ion beams through the holes of grid system 150 to bombard wafer 154 to remove material from wafer 154. For example, argon ions can be extracted from an ICP source, accelerated and directed by grid system 150 to form mono-energetic beams, such as ion beam 141, ion beam 142, and ion beam 143 to etch any materials, such as piezoelectric and ferroelectrics, magnetics materials, group III-V elements of the periodic table (e.g., GaAs, InP, GaN, AlN . . . ), ohmic metals (e.g., Au, Pt, Cu, Ir . . . ), and hard mask materials (e.g., Ag, TiWN, Ni, . . . ) on wafer 154. In some embodiments, IBE system 100 can have a wide range energy capability (from about 50 V to about 800 V) for low ion damage or for fast etch of various materials.

In some embodiments, plasma chamber 103, which can be an ICP source, can include a 350 mm diameter quartz vessel with a radio frequency (RF) plasma generator. An antenna (not shown) can be wrapped around the quartz vessel for inductive coupling. The antenna can operate at about 1.8 MHz and about 2 kW power. The oscillating current in the antenna at about 1.8 MHz can induce an electromagnetic field in the quartz vessel. During plasma ignition, some primary electrons can collect the electromagnetic field energy and agitate accordingly. Main plasma can be created inside the quartz vessel of plasma chamber 103 by inelastic collisions between hot electrons and neutrals (injected Argon gas) which generate ions/electrons pairs.

Grid system 150 can extract ions from plasma within plasma chamber 103, and accelerate the ions to build mono-energetic beams, such as ion beam 141, ion beam 142, and ion beam 143 through the holes of grid system 150. This can be done by applying specific voltages to each grid of grid system 150, which will be shown in more details in FIG. 1B. The inner grid, which is screen grid 110, can be in contact with plasma chamber 103, and can receive a screen grid voltage to extract ions from the plasma within plasma chamber 103 to form an ion beam, such as ion beam 141, ion beam 142, and ion beam 143, through the holes of grid system 150. Positive ions in the plasma within plasma chamber 103 that drift close to screen grid 110 can be extracted through the holes, while electrons can be separated and kept inside plasma source 103. There are some space shown in FIG. 1A between screen grid 110 and plasma chamber 103 for illustration purposes. The second grid, which is extraction grid 115, can receive an extraction grid voltage. A voltage difference between the screen grid voltage and the extraction grid voltage can determine an ion current density of the ion beam, such as ion beam 141, ion beam 142, and ion beam 143, through the holes of grid system 150. The third grid, which is accelerator grid 120, can receive an accelerator grid voltage. A voltage difference between the extraction grid voltage and the accelerator grid voltage can determine an ion beam energy for the ion beam, such as ion beam 141, ion beam 142, and ion beam 143, through the holes of grid system 150. The fourth grid, which is decelerator grid 130, can be held at ground voltage. Decelerator grid 130 reduces divergence of the ion beams and can create another electric field which can prevent electrons emitted by plasma bridge neutralizer 106 from back-streaming into grid system 150.

Mechanical shutter 105 can be placed downstream of grid system 150. When closed, process chamber 101 is protected and no etching takes place. This closed position allows for stabilization of the different parts such as plasma source, beam voltage, ions acceleration, and more. Mechanical shutter 105 is open when the whole system is stable (e.g. ions beam fully collimated and mon-energetic, substrate fixture correctly clamped and cooled-down, etc.) to ensure constant, precise, and repeatable processes.

Plasma bridge neutralizer (PBN) 106 is an electrons source placed downstream from grid system 150 to neutralize the charged ion beam. The electrons cannot back-stream into grid system 150 because of the negative decelerator-accelerator electric field. These electrons do not combine with the ions present in the beam, but they provide a charge balance for the ions in order to avoid space or surface charging on wafer 154.

Secondary ions mass spectrometer 108 can be used to monitor sputtered material species, allowing etching to be stopped at specific layers. When wafer 154 is bombarded by the ion beams, such as ion beam 141, ion beam 142, and ion beam 143, secondary ions can be ejected from the surface of wafer 154. These ejected secondary ions can be collected and a mass analyzer (quadrupole) can isolate them according to their mass in order to determine the elemental composition of the sputtered surface. A detection system (electron multiplier) can amplify and display the counts (magnitude) of the secondary ions in real time.

In addition, IBE system 100 can include other structural and functional components, such as RF generators, matching circuits, chamber liners, control circuits, actuators, power supplies, exhaust systems, etc. which are not shown for simplicity.

FIG. 1B illustrates further details of grid system 150 including screen grid 110, extraction grid 115, accelerator grid 120, and decelerator grid 130. Screen grid 110 can include screen grid elements, such as a screen grid element 111, a screen grid element 112, and a screen grid element 113. The screen grid elements, such as screen grid element 111, screen grid element 112, and screen grid element 113, are in contact with plasma chamber 103. Extraction grid 115 is disposed adjacent to and separated from screen grid 110. Extraction grid 115 includes extraction grid elements, such as an extraction grid element 116, an extraction grid element 117, and an extraction grid element 118. Accelerator grid 120 is disposed adjacent to and separated from extraction grid 115. Accelerator grid 120 includes accelerator grid elements, such as an accelerator grid element 121, an accelerator grid element 122, and an accelerator grid element 123. Decelerator grid 130 is disposed adjacent to and separated from accelerator grid 120. Decelerator grid 130 includes decelerator grid elements, such as a decelerator grid element 131, a decelerator grid element 132, and a decelerator grid element 133. Grid system 150 includes holes, such as hole 151, hole 152, and hole 153. Holes 151, 152, and 153 extend through screen grid 110, extraction grid 115, accelerator grid 120, and decelerator grid 130. In some embodiments, the holes, such as hole 151, hole 152, and hole 153, include molybdenum electrostatic apertures of various diameters at different grid elements. For example, hole 151 includes an aperture 161 at screen grid 110, an aperture 162 at extraction grid 115, an aperture 163 at accelerator grid 120, and an aperture 164 at decelerator grid 130. Apertures 161, 162, 163, and 164 have different diameters. More details of hole 151 are shown in FIGS. 1H and 1J.

In some embodiments, a screen grid voltage 124 is supplied to screen grid 110 to extract ions from the plasma within plasma chamber 103 to form ion beam 141 through hole 151. An extraction grid voltage 125 is supplied to extraction grid 115, where a voltage difference between screen grid voltage 124 and extraction grid voltage 125 can determine an ion current density of ion beam 141 through hole 151. An accelerator grid voltage 126 is supplied to accelerator grid 120, where a voltage difference between extraction grid voltage 125 and accelerator grid voltage 126 can determine an ion beam energy for ion beam 141 through hole 151. A decelerator grid voltage 127 is supplied to decelerator grid 130. In some embodiments, decelerator grid voltage 127 can be a ground voltage.

In some embodiments, control unit 104 is configured to control various operations of IBE system 100, e.g., supplying voltages for grid system 150. In some embodiments, as shown in FIG. 1C, screen grid voltage 124 is a positive voltage with respect to a ground voltage, extraction grid voltage 125 is also a positive voltage with respect to the ground voltage, accelerator grid voltage 126 is a negative voltage with respect to the ground voltage, and decelerator grid voltage 127 is the ground voltage. In some embodiments, screen grid voltage 124 can be about 1000 volt to about 1200 volt, extraction grid voltage 125 can be about 800 volt to about 1000 volt, accelerator grid voltage 126 can be about −200 volt to about −400 volt, and decelerator grid voltage 127 can be the ground voltage. In some embodiments, different voltages can be supplied to different accelerator grid elements.

Ions generated from the plasma within plasma chamber 103 go through the holes to form ion beams, such as ion beam 141 through hole 151, ion beam 142 through hole 152, and ion beam 143 through hole 153. The ion beams perform directional etching on wafer 154. An ion beam through a hole is controlled by a combination of a screen grid element, an extraction grid element, an accelerator grid element, and a decelerator grid element.

In some embodiments, as shown in FIG. 1D, ion beam 141 is controlled by screen grid element 111, extraction grid element 116, accelerator grid element 121, and decelerator grid element 131. Ion beam 141 reaches the surface of wafer 154 at an incidence point 155. Hence, ion beam 141 has an incidence distance E1 measured from the source of ion beam 141, or an ion source, to point 155. The source of ion beam 141 can be counted as the external edge of plasma chamber 103 where the ions are extracted from.

Referring back to FIG. 1B, similarly, ion beam 142 is controlled by screen grid element 112, extraction grid element 117, accelerator grid element 122, and decelerator grid element 132. Ion beam 143 is controlled by screen grid element 113, extraction grid element 118, accelerator grid element 123, and decelerator grid element 133. Ion beam 142 has an incidence distance E2 measured from the source of ion beam 142 to an incidence point 156 of ion beam 142. Ion beam 143 has an incidence distance E3 measured from the source of ion beam 143 to an incidence point 157 of ion beam 143. The source of ion beam 141, the source of ion beam 142, and the source of ion beam 143, can be a same or parallel aligned. In some embodiments, the incidence distance E1, the incidence distance E2, and incidence distance E3, are different from each other.

Therefore, ions in different ion beams travel different incidence distances to reach the different locations of the wafer surface. The differences in the incidence distances of ion beams can result in different etching rates at different locations of the wafer surface, which may be referred to as asymmetry etching issue or pitch walking issue. An etching rate at a point of wafer 154 can be a function of the energy of the ions reaching the point and the distance of the ions travel to reach the point, e.g., the incidence distance of the ion beam. In general, the etching rate at a location of a tilted wafer surface is near inversely proportional to an incidence distance of the corresponding ion beam incidence to the location. When all ion beams are supplied by the same energy, the etching rate of incidence point 157 by ion beam 143 can be lower than the etching rate of incidence point 156 by ion beam 142, since the incidence distance of ion beam 143 is longer than the incidence distance of ion beam 142. Rotation of the tilted wafer would not be able to solve the asymmetry etching behavior problem for the IBE process.

With the addition of extraction grid 115, the ion density and ion energy are decoupled in the four grids, where the ion current density are controlled by the screen grid and extraction grid. Ions energy are accelerated via the electrostatic field between the extraction grid and the accelerator grid. Embodiments here can adjust the voltage difference between screen grid voltage 124 and extraction grid voltage 125 to adjust the ion current density of ion beams through the holes, and further adjust the voltage difference between extraction grid voltage 125 and accelerator grid voltage 126 to adjust an ion beam energy for ion beams through the holes. By adjusting the various voltage differences, ion beams are supplied by different energy so that the etching rate can be the same at different locations.

FIGS. 1E-1J illustrate cross-sectional views of portions of IBE system 100 with five grids including screen grid 110, extraction grid 115, accelerator grid 120, decelerator grid 130, deflector system 134, or deflector system 137, in accordance with some embodiments. The addition of deflector system 134 or deflector system 137, which can be counted as a fifth grid, can provide additional control over the etching rate of a wafer in different locations.

Figure 1E:
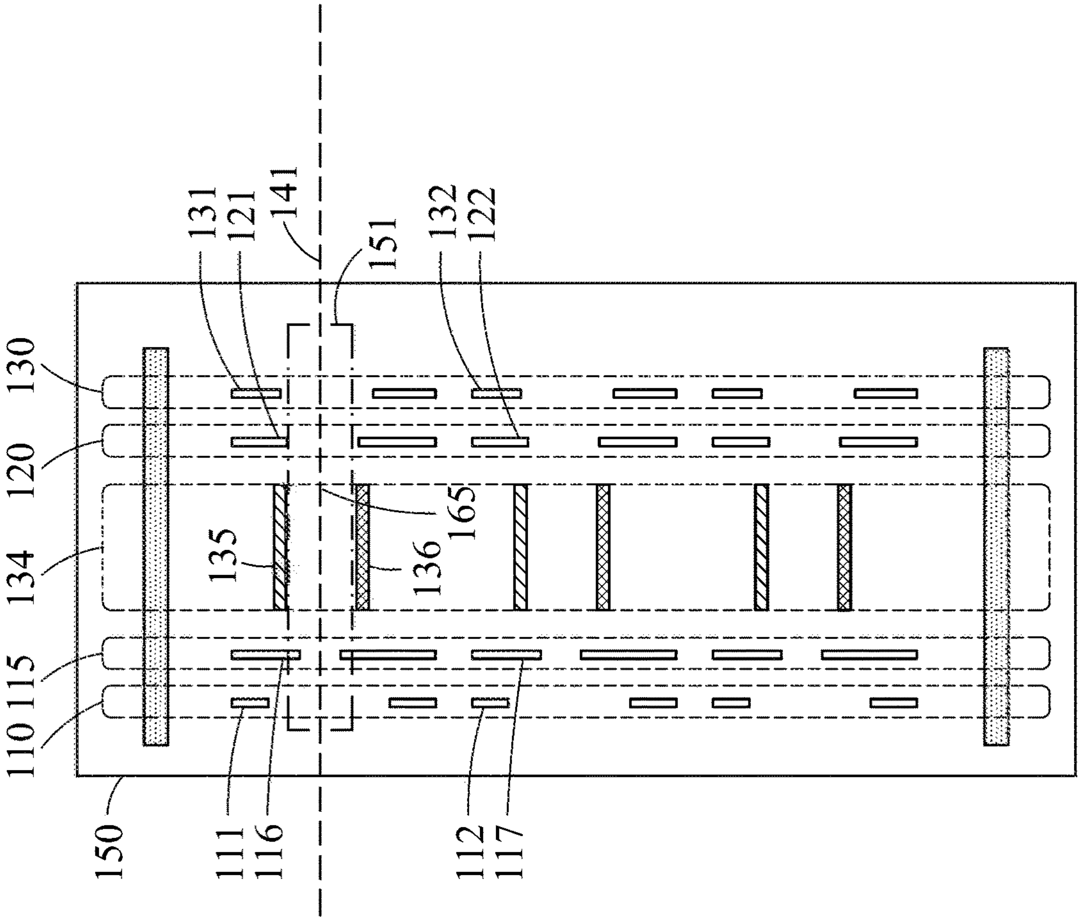
FIGS. 1E-1J illustrate cross-sectional views of portions of an IBE system with five grids, in accordance with some embodiments.

FIG. 1E illustrates further details of grid system 150 including screen grid 110, extraction grid 115, accelerator grid 120, decelerator grid 130, and deflector system 134 including deflector plates, such as a deflector plate 135 and a deflector plate 136. Screen grid 110 can include screen grid elements, such as screen grid element 111, screen grid element 112, and screen grid element 113. Extraction grid

Figure 1F:
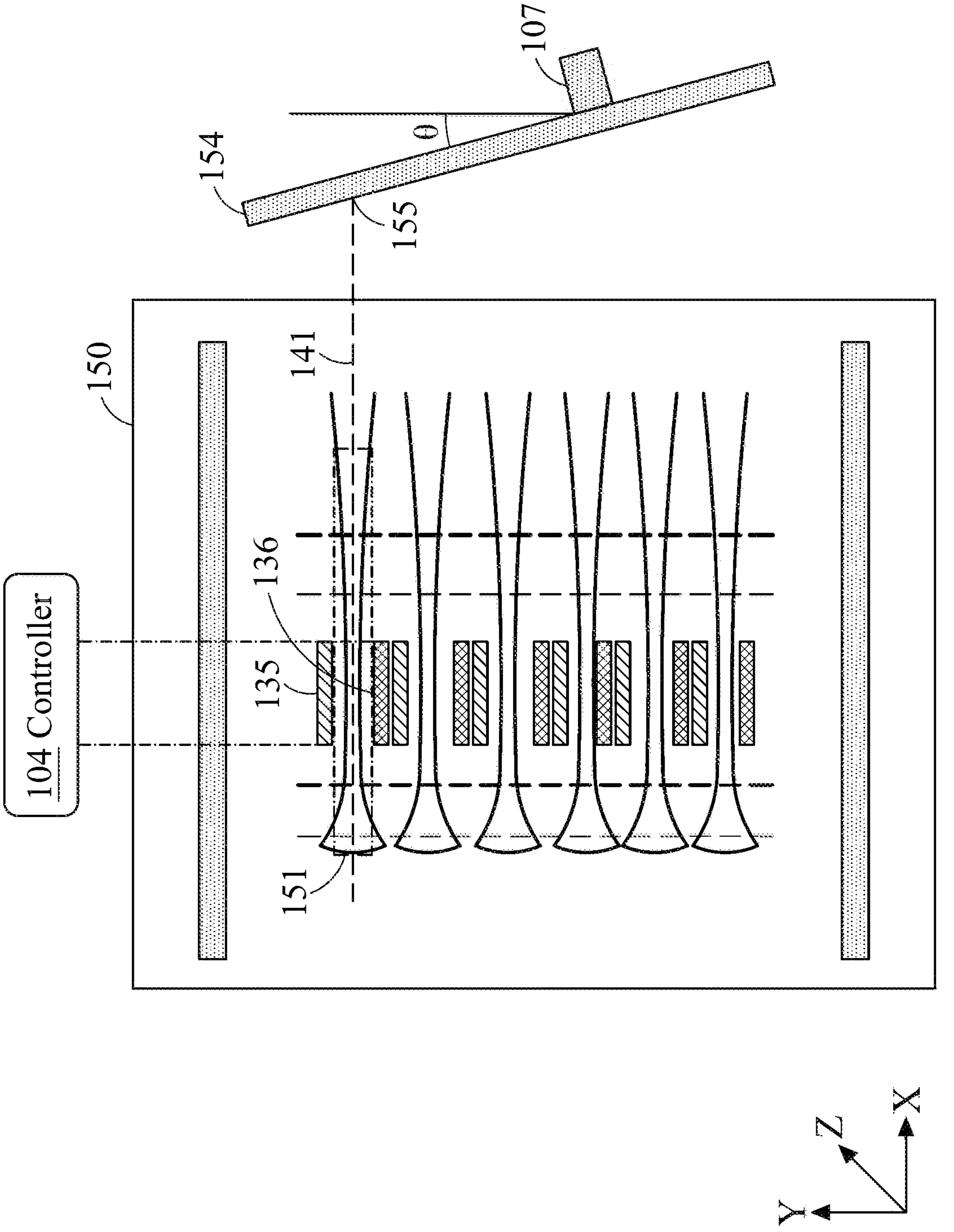

115 includes extraction grid elements, such as extraction grid element 116, extraction grid element 117, and extraction grid element 118. Accelerator grid 120 includes accelerator grid elements, such as accelerator grid element 121, accelerator grid element 122, and accelerator grid element 123. Decelerator grid 130 includes decelerator grid elements, such as decelerator grid element 131, decelerator grid element 132, and decelerator grid element 133. Grid system 150 includes holes, such as hole 151, hole 152, and hole 153. Holes 151, 152, and 153 extend through screen grid 110, extraction grid 115, accelerator grid 120, and decelerator grid 130. Ion beam 141 can go through hole 151 to reach location 155 of wafer 154 as shown in FIG. 1B and FIG. 1F. Similarly, ion beams 142 and 143 can go through respective holes 152 and 153 to reach other locations of wafer 154.

In addition, grid system 150 includes deflector system 134 having deflector plate 135 and deflector plate 136, which are separated by a gap 165 around hole 151. Similar deflector plates are formed around holes, such as hole 152 and hole 153. Deflector plate 135 and deflector plate 136 can have a length of about 20 mm to 90 mm. Gap 165 can have a height of about 5 mm to about 12 mm. Deflector plate 135 and deflector plate 136 can be disposed between extraction grid 115 and accelerator grid 120.

Figure 1G:
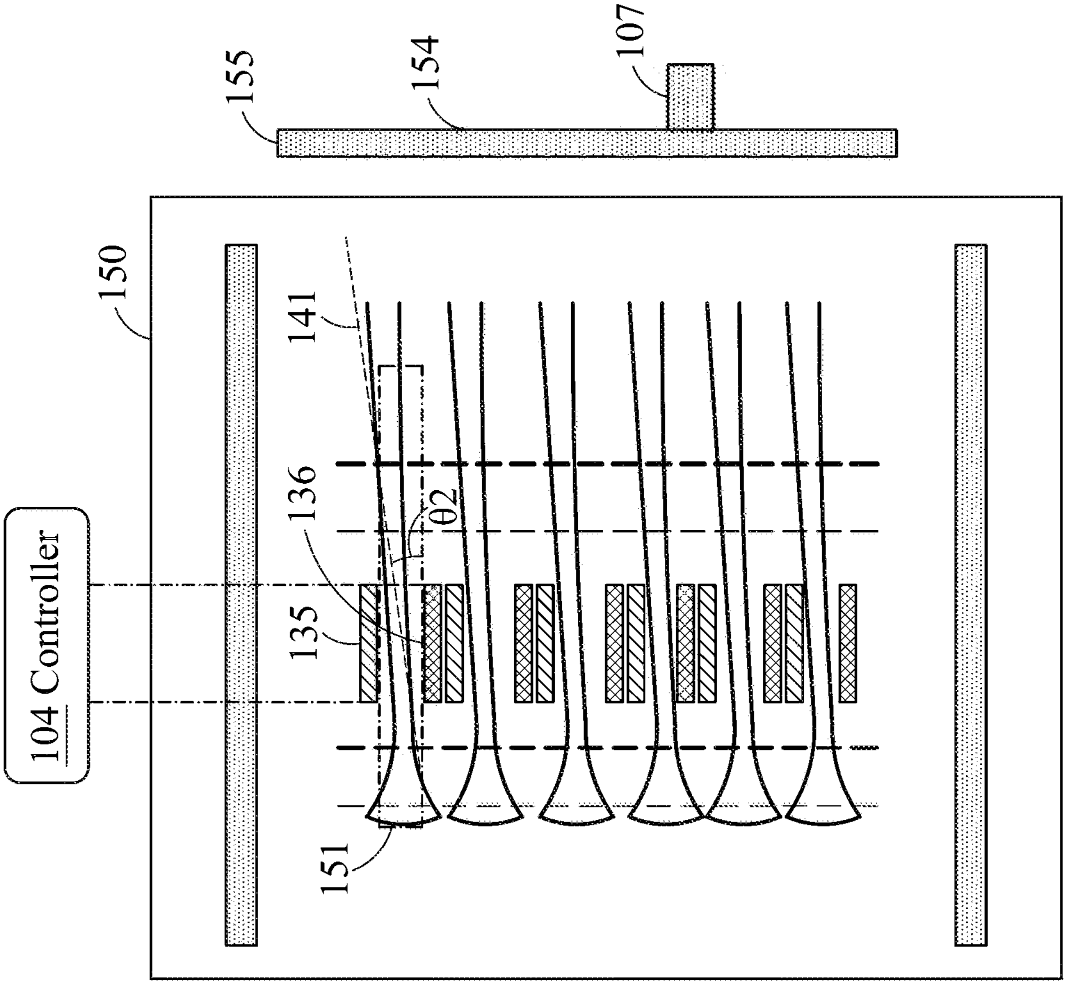
Figure 1H:
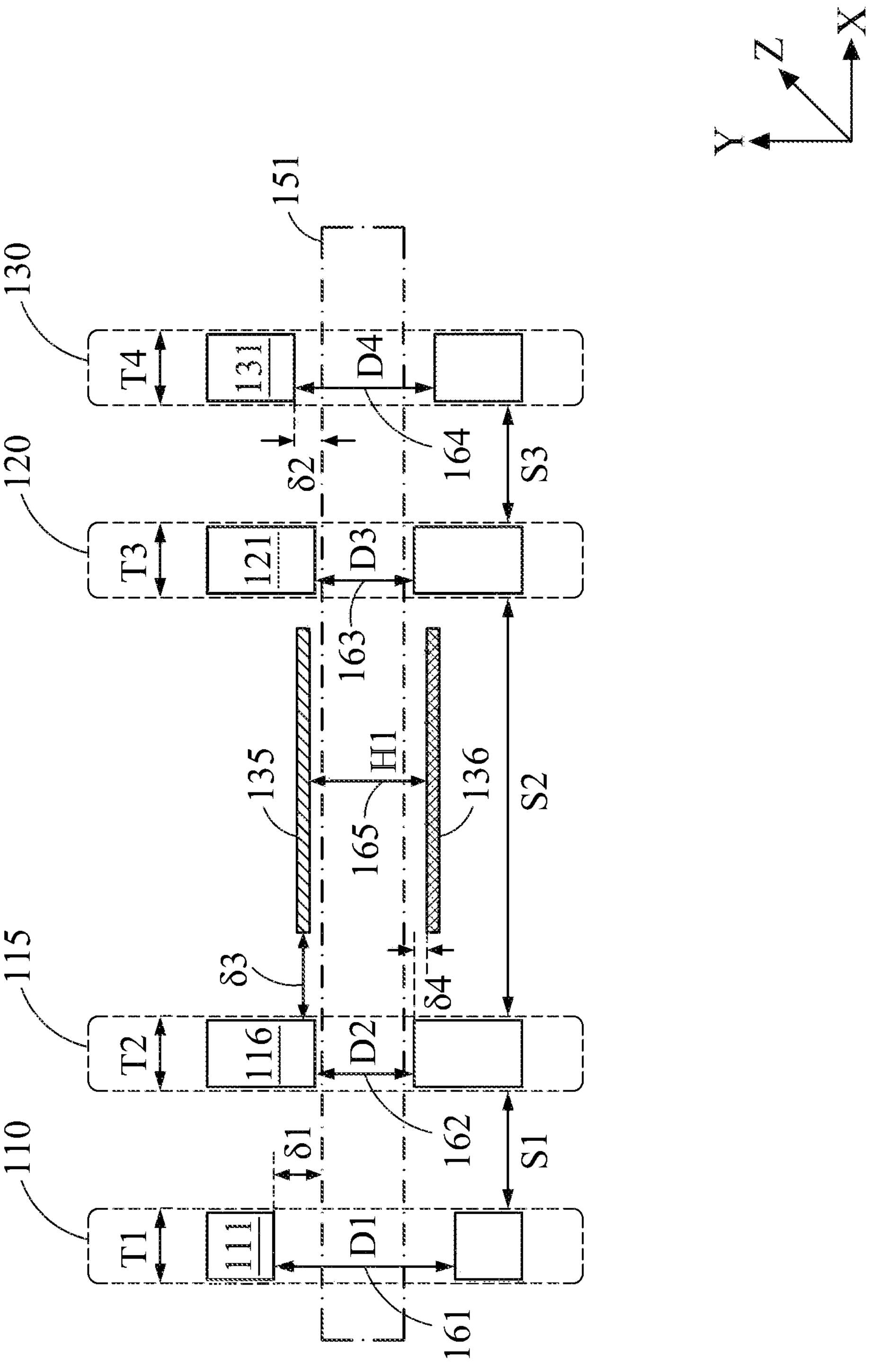

Deflector plate 135 can receive a first deflector voltage, and deflector plate 136 can receive a second deflector voltage. The first deflector voltage can have a first voltage polarity different from the second voltage polarity of the second deflector voltage. For example, the first deflector voltage is a positive voltage, and the second voltage is a negative voltage. A voltage difference between the first deflector voltage and the second deflector voltage determines a trajectory of ion beam 141. As shown in FIG. 1F, when the voltage difference between the first deflector voltage and the second deflector voltage is zero, the trajectory of ion beam 141 can be in parallel with an X-axis to reach location 155 of wafer 154 as if there was no deflector plate 135 and deflector plate 136. On the other hand, as shown in FIG. 1G, when the voltage difference between the first deflector voltage and the second deflector voltage is larger than zero, the trajectory of ion beam 141 can have a tilt angle $\theta 2$ to reach location 155 of wafer 154 to perform directional etching of the wafer, where wafer 154 is not tilted. The tilt angle $\theta 2$ of ion beam 141 can depend on the voltage difference between the first deflector voltage and the second deflector voltage.

In some embodiments, as shown in FIG. 1F, control unit 104 can control the first deflector voltage to deflector plate 135 and the second deflector voltage to deflector plate 136 to have a first voltage difference, e.g., zero voltage difference, to generate a first directional etching effect at location 155 of wafer 154 when rotating fixture 107 holds wafer 154 in a first tilt angle $\theta$. As shown in FIG. 1G, control unit 104 can control the first deflector voltage to deflector plate 135 and the second deflector voltage to deflector plate 136 to have a second voltage difference so that ion beam 141 can have a tilt angle $\theta 2$ while rotating fixture 107 holds wafer 154 in a second tilt angle, e.g., zero degree. As a result, ion beam 141 reaches location 155 to generate a second directional etching effect at location 155. Control unit 104 can adjust the first voltage difference and the second voltage difference to have the first directional etching effect to wafer 154 as the same as the second directional etching effect to wafer 154, such as the same etching opening length or width.

As shown in FIG. 1H, in some embodiments, hole 151 includes aperture 161 at screen grid 110, aperture 162 at extraction grid 115, aperture 163 at accelerator grid 120, and aperture 164 at decelerator grid 130. A diameter D1 of apertures 161 on screen grid 110 can be greater than a diameter D2 of aperture 162 on extraction grid 115. Diameter D2 of aperture 162 is further smaller than a diameter D3 of aperture 163 on accelerator grid 120. And a diameter D4 of aperture 164 on decelerator grid 130 can be greater than diameter D3 of aperture 163 on accelerator grid 120. In some embodiments, diameter D1 can range from about 4 mm to about 7 mm. Diameter D2 can range from about 2 mm to about 5 mm. Diameter D3 can range from about 2 mm to about 6 mm. Diameter D4 can range from about 3 mm to about 7 mm. In some embodiments, a difference 81 between diameters D1 and D2 can range from about 0.5 mm to about 4 mm. In some embodiments, a different 82 between diameters D3 and D4 can range from about 0.5 mm to about 2.5 mm. Screen grid 110 with diameter D1 greater than diameter D2 of extraction grid 115 and D3 of accelerator grid 120 can increase the number of ions in ion beam 141 through hole 151. Extraction grid 115 with diameter D2 and accelerator grid 120 with diameter D3 less than diameter D1 can accelerate and focus ions in ion beam 141. In some embodiments, diameter D1 can be greater than, less than, or the same as diameter D4.

In some embodiments, screen grid 110 can have a thickness T1 along an X-axis ranging from about 0.3 mm to about 0.8 mm. In some embodiments, extraction grid 115 can have a thickness T2 along an X-axis ranging from about 0.4 mm to about 1.0 mm. In some embodiments, accelerator grid 120 can have a thickness T3 along an X-axis ranging from about 0.4 mm to about 1.2 mm. In some embodiments, decelerator grid 130 can have a thickness T4 along an X-axis ranging from about 0.4 mm to about 1.2 mm.

In some embodiments, a separation space S1 along an X-axis between screen grid 110 and extraction grid 115 can range from about 0.4 mm to about 0.6 mm. A separation space S2 along an X-axis between extraction grid 115 and accelerator grid 120 can range from about 25 mm to about 45 mm. A separation space S3 along an X-axis between accelerator grid 120 and decelerator grid 130 can range from about 0.5 mm to about 0.7 mm.

In some embodiments, deflector plate 135 and deflector plate 136 are separated by gap 165 of height H1 along an Y-axis in a range of about 5 mm to about 8 mm. Deflector plate 135 and deflector plate 136 can have a length of about 22 mm to 40 mm. A ratio between the length of deflector plate 135 and height H1 can be in a range of about 3 to about 8. Deflector plate 135 and deflector plate 136 can be disposed between extraction grid 115 and accelerator grid 120. Deflector plate 135 and deflector plate 136 can be separated from extraction grid 115 along an X-axis by a distance 83 in a range of about 0.5 mm to about 8 mm. Deflector plate 136 can have a distance 84 below the surface of extraction element 116, where 84 is in a range of about 0.5 mm to about 8 mm.

With the configurations of screen grid 110, extraction grid 115, accelerator grid 120, and decelerator grid 130 as shown in FIGS. 1E-1H, ions in plasma chamber 103 can be focused through these grids without direct interception and form ion beam 141 through hole 151. Deflector plate 135 and deflector plate 136 can be used to control the direction of ion beam 141.

In some embodiments, deflector plate 135 and deflector plate 136 can be adjustable in positions, and move in an up direction or a down direction so that distance 84 can be larger or smaller. Deflector plate 135 and deflector plate 136 can also move in a left direction or a right direction so that distance 83 can be larger or smaller. Deflector plate 135 can move up and deflector plate 136 can move down so that gap 165 can be wider. In addition, deflector plate 135 can move down and deflector plate 136 can move up so that gap 165 can be narrower.

Figure 1I:
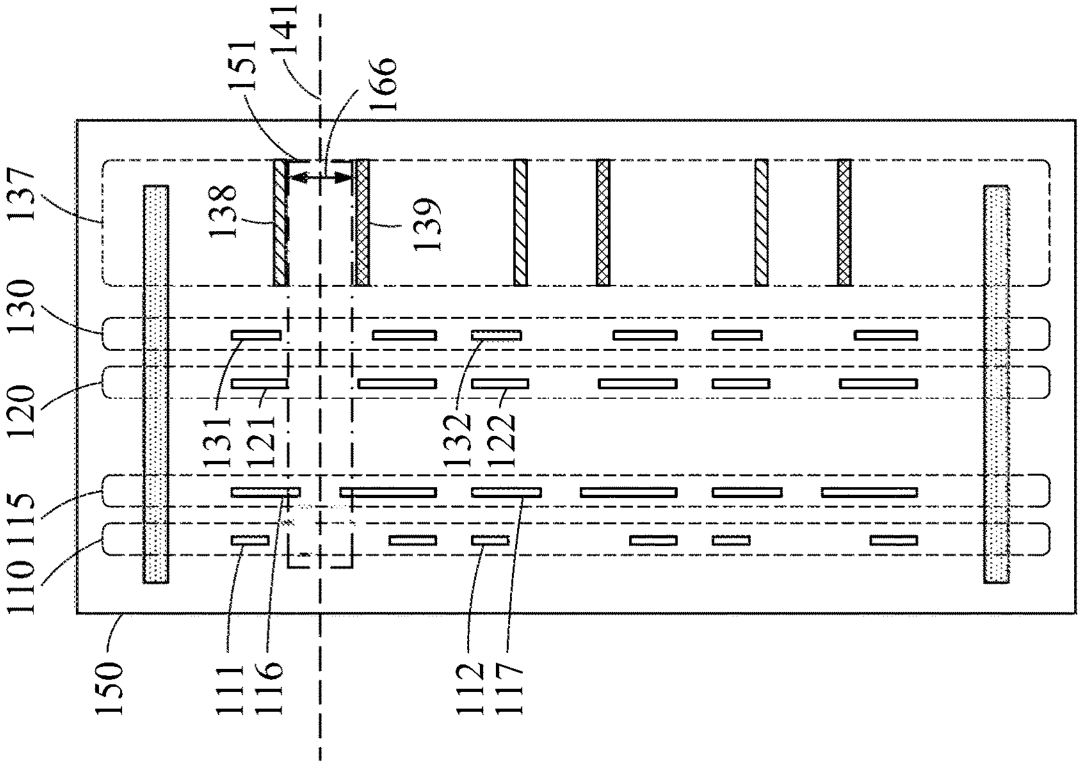
Figure 1J:
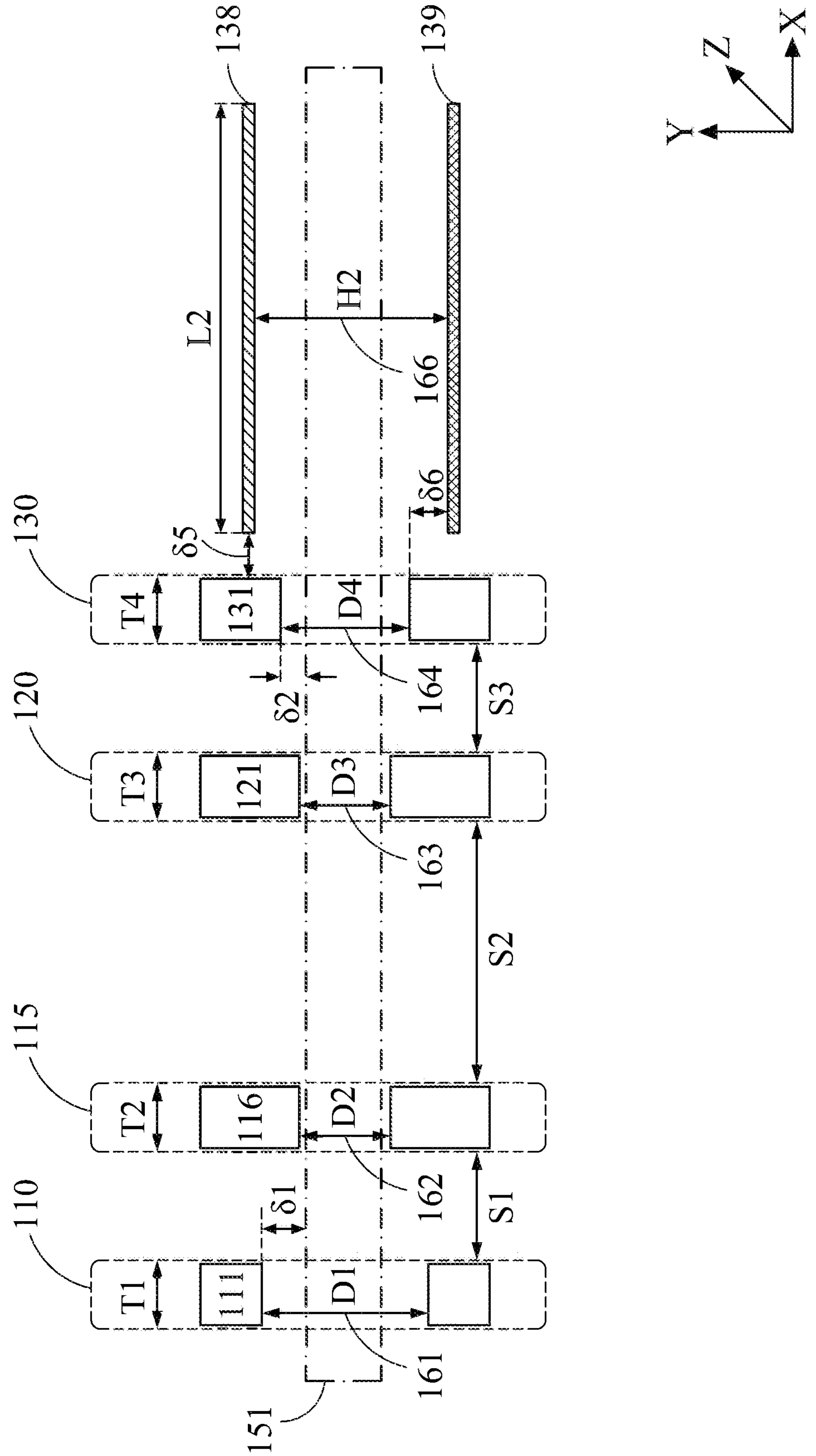

FIG. 1I illustrates further details of another example grid system 150 including screen grid 110, extraction grid 115, accelerator grid 120, decelerator grid 130, and deflector system 137 including deflector plates, such as a deflector plate 138 and a deflector plate 139. The discussion of deflector system 134 applies to deflector system 137, unless mentioned otherwise. Deflector system 137 can be placed in a location different from the location of deflector system 134 shown in FIG. 1E-1H. Compared to deflector system 134 placed between extraction grid 115 and the accelerator grid 120, deflector system 137 disposed adjacent to and separated from the decelerator grid can create a wider tile angle for ion beam 141.

Screen grid 110 can include screen grid elements, such as screen grid element 111, screen grid element 112, and screen grid element 113. Extraction grid 115 includes extraction grid elements, such as extraction grid element 116, extraction grid element 117, and extraction grid element 118. Accelerator grid 120 includes accelerator grid elements, such as accelerator grid element 121, accelerator grid element 122, and accelerator grid element 123. Decelerator grid 130 includes decelerator grid elements, such as decelerator grid element 131, decelerator grid element 132, and decelerator grid element 133. Grid system 150 includes holes, such as hole 151, hole 152, and hole 153. Holes 151, 152, and 153 extend through screen grid 110, extraction grid 115, accelerator grid 120, and decelerator grid 130. Ion beam 141 can go through hole 151 to reach a surface of a wafer, e.g., wafer 154 as shown in FIG. 1B. Similarly, ion beams 142 and 143 can go through respective holes 152 and 153 to reach other locations of wafer 154.

In addition, grid system 150 includes deflector system 137 having deflector plate 138 and deflector plate 139, which are separated by a gap 166 around hole 151. Similar deflector plates are formed around other holes, such as hole 152 and hole 153. Deflector plate 138 and deflector plate 139 can have a length of about 20 mm to 90 mm. Gap 166 can have a height H2 of about 5 mm to about 12 mm. A ratio between the length of deflector plate 138 and height H2 can be in a range of about 2 to about 16. Deflector plate 138 and deflector plate 139 can be disposed adjacent to and separated from decelerator grid 130, and separated from accelerator grid 120 by decelerator grid 130.

Deflector plate 138 can receive a first deflector voltage, and deflector plate 139 can receive a second deflector voltage. The first deflector voltage can have a first voltage polarity different from a second voltage polarity of the second deflector voltage. A voltage difference between the first deflector voltage and the second deflector voltage determines a trajectory of ion beam 141. The trajectory of ion beam 141 can include a tilt angle of ion beam 141 to reach a wafer surface to perform directional etching of the wafer. The tilt angle of ion beam 141 can depend on the voltage difference between the first deflector voltage and the second deflector voltage. The tilt angle of ion beam 141 and its relationship with the voltage difference between the first deflector voltage and the second deflector voltage can be similar to the relationship shown in FIGS. 1F-1G.

As shown in FIG. 1J, in some embodiments, hole 151 includes aperture 161 at screen grid 110, aperture 162 at extraction grid 115, aperture 163 at accelerator grid 120, and aperture 164 at decelerator grid 130. A diameter D1 of apertures 161 on screen grid 110 can be greater than a diameter D2 of aperture 162 on extraction grid 115. Diameter D2 of aperture 162 is smaller than a diameter D3 of aperture 163 on accelerator grid 120. A diameter D4 of aperture 164 on decelerator grid 130 can be greater than diameter D3 of aperture 163 on accelerator grid 120. In some embodiments, diameter D1 can range from about 4 mm to about 7 mm. Diameter D2 can range from about 2 mm to about 5 mm. Diameter D3 can range from about 2 mm to about 6 mm. Diameter D4 can range from about 3 mm to about 7 mm. In some embodiments, a difference 81 between diameters D1 and D2 can range from about 0.5 mm to about 4 mm. In some embodiments, a different 82 between diameters D3 and D4 can range from about 0.5 mm to about 2.5 mm. Screen grid 110 with diameter D1 greater than diameter D2 of extraction grid 115 and D3 of accelerator grid 120 can increase the number of ions in ion beam 141 through hole 151. Extraction grid 115 with diameter D2 and accelerator grid 120 with diameter D3 less than diameter D1 can accelerate and focus ions in ion beam 141. In some embodiments, diameter D1 can be greater than, less than, or the same as diameter D4.

In some embodiments, screen grid 110 can have a thickness T1 along an X-axis ranging from about 0.3 mm to about 0.8 mm. In some embodiments, extraction grid 115 can have a thickness T2 along an X-axis ranging from about 0.4 mm to about 1.0 mm. In some embodiments, accelerator grid 120 can have a thickness T3 along an X-axis ranging from about 0.4 mm to about 1.2 mm. In some embodiments, decelerator grid 130 can have a thickness T4 along an X-axis ranging from about 0.4 mm to about 1.2 mm.

In some embodiments, a separation space S1 along an X-axis between screen grid 110 and extraction grid 115 can range from about 0.4 mm to about 0.6 mm. A separation space S2 along an X-axis between extraction grid 115 and accelerator grid 120 can range from about 25 mm to about 45 mm. A separation space S3 along an X-axis between accelerator grid 120 and decelerator grid 130 can range from about 0.5 mm to about 0.7 mm.

In some embodiments, deflector plate 138 and deflector plate 139 can be separated by gap 166 of height H2 along an Y-axis in a range of about 7 mm to about 9 mm. Deflector plate 138 and deflector plate 139 can have a length of about 40 mm to about 80 mm. A ratio between the length of deflector plate 138 and height H2 can be in a range of about 2 to about 16. Deflector plate 138 and deflector plate 139 can be disposed adjacent to and separated from decelerator grid 130. Deflector plate 138 and deflector plate 139 can be separated from decelerator grid 130 along an X-axis by a distance 85 in a range of about 0.5 mm to about 8 mm. Deflector plate 139 can have a distance 86 below the surface of decelerator element 131, where 86 is in range of about 0.5 mm to about 8 mm.

With the configurations of screen grid 110, extraction grid 115, accelerator grid 120, and decelerator grid 130 as shown in FIGS. 1I-1J, ions in plasma chamber 103 can be focused through these grids without direct interception and form ion beam 141 through hole 151. Deflector plate 138 and deflector plate 139 can be used to control the direction of ion beam 141.

In some embodiments, deflector plate 138 and deflector plate 139 can be adjustable in positions, and move in an up direction or a down direction so that distance 86 can be larger or smaller. Deflector plate 138 and deflector plate 139 can also move in a left direction or a right direction so that distance 85 can be larger or smaller. Deflector plate 138 can move up and deflector plate 139 can move down so that gap 166 can be wider. In addition, deflector plate 138 can move down and deflector plate 139 can move up so that gap 165 can be narrower.

Figure 2A:
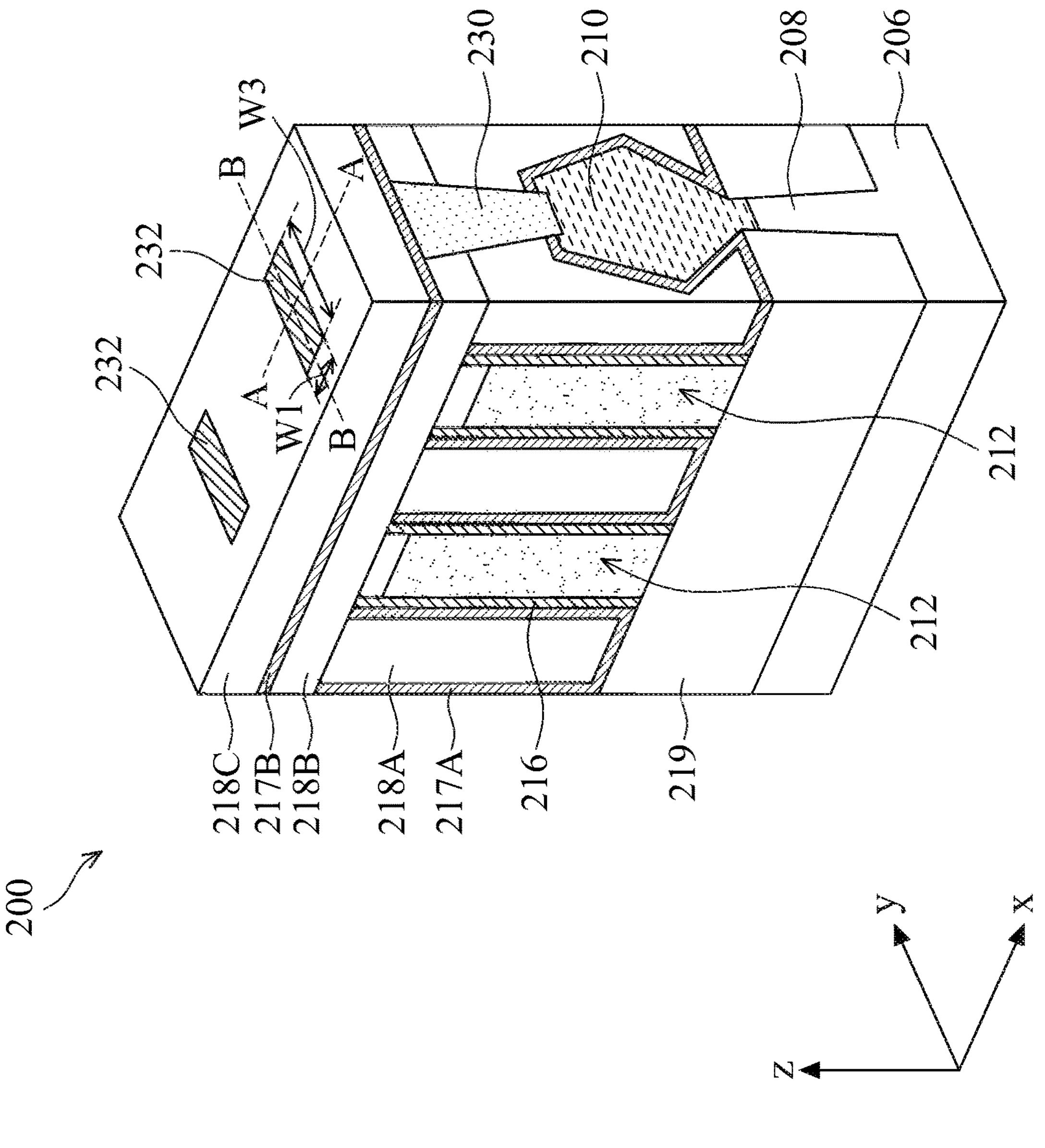
FIGS. 2A-2C illustrate isometric view and cross-sectional views of a semiconductor device with contact structures formed using an IBE system, in accordance with some embodiments.
Figure 2B:
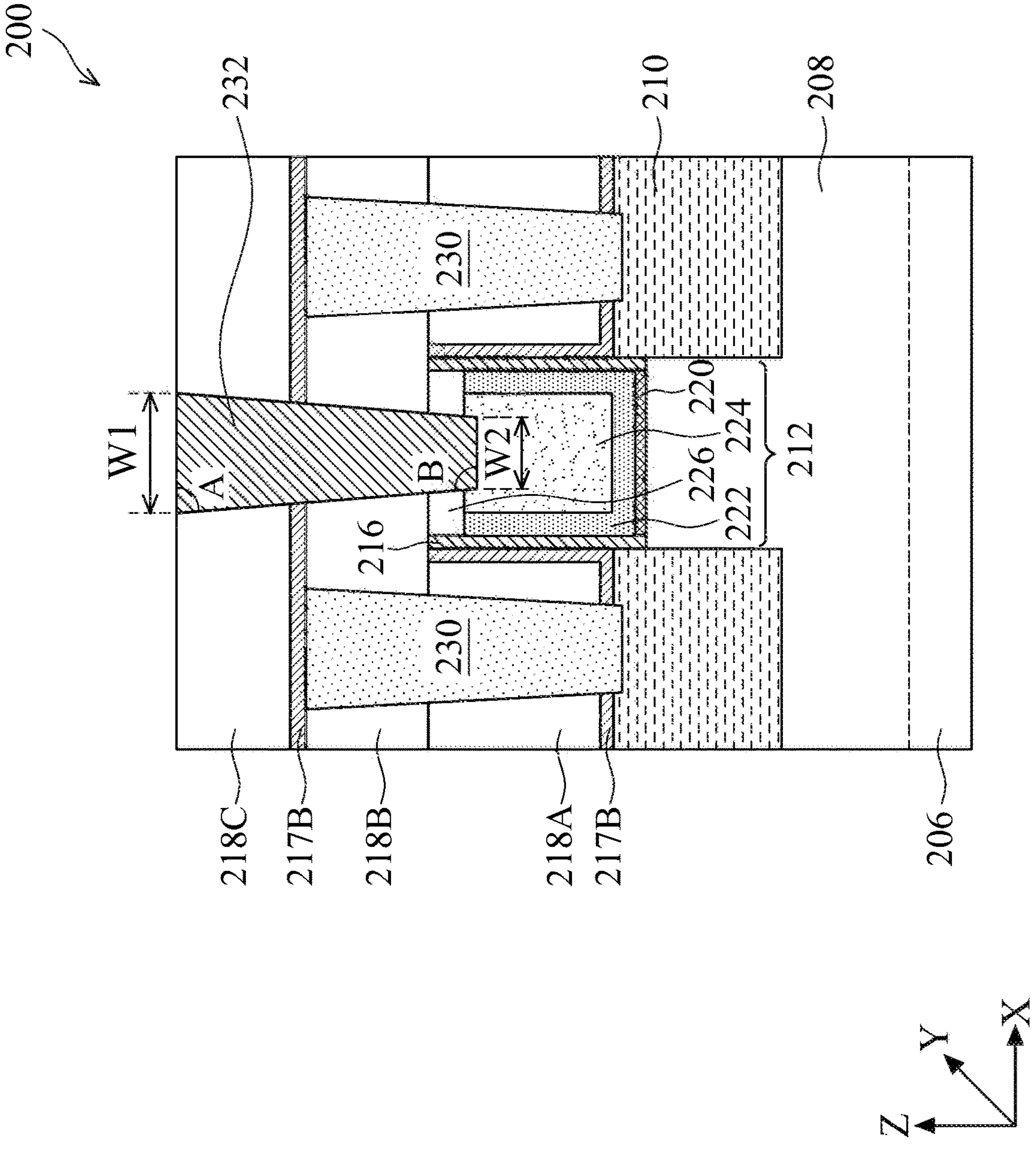

FIG. 2A illustrates an isometric view of a field effect transistor (FET) 200 (also referred to as semiconductor device 200) after the formation of gate contact structures 232 using IBE system 100, according to some embodiments. FIGS. 2B, 2D, and 2F illustrate cross-sectional views of FET 200 along line A-A of FIG. 2A and FIGS. 2C, 2E, and 2G illustrate cross-sectional views along line B-B of FIG. 2A with additional structures that are not shown in FIG. 2A for simplicity. The discussion of elements in FIGS. 2A-2G with the same annotations applies to each other, unless mentioned otherwise. In some embodiments, FET 200 can represent n-type FET 200 (NFET 200) or p-type FET 200 (PFET 200) and the discussion of FET 200 applies to both NFET 200 and PFET 200, unless mentioned otherwise.

Referring to FIG. 2A, FET 200 can include an array of gate structures 212 disposed on a fin structure 208, gate contact structures 232 disposed on gate structures 212, an array of S/D regions 210 (one of S/D regions 210 visible in FIG. 2A) disposed on portions of fin structure 208 that are not covered by gate structures 212, and S/D contact structures 230 (one of S/D contact structures 230 visible in FIG. 2A). FET 200 can further include gate spacers 216, shallow trench isolation (STI) regions 219, etch stop layers (ESLs) 217A-217B, and interlayer dielectric (ILD) layers 218A-218C. In some embodiments, gate spacers 216, STI regions 219, ESLs 217A-217B, and ILD layers 218A-218C can include an insulating material, such as silicon oxide, silicon nitride (SiN), silicon carbon nitride (SiCN), silicon oxycarbon nitride (SiOCN), and silicon germanium oxide.

FET 200 can be formed on a substrate 206. There may be other FETs and/or structures (e.g., isolation structures) formed on substrate 206. Substrate 206 can be a semiconductor material, such as silicon, germanium (Ge), silicon germanium (SiGe), a silicon-on-insulator (SOI) structure, and a combination thereof. In some embodiments, fin structure 208 can include a material similar to substrate 206 and extend along an X-axis.

Referring to FIGS. 2A-2B, S/D regions 210 can include epitaxially-grown semiconductor material, such as Si or SiGe, and n-type dopants, such as phosphorus or p-type dopants, such as boron. S/D contact structures 230 are disposed on S/D region 210 and within ILD layers 218A-218B and ESL 217A. In some embodiments, S/D contact structure 230 can include a silicide layer and a contact plug disposed on the silicide layer. In some embodiments, via structures (not shown) can be disposed on S/D contact structures 230 and within ILD layer 218C and ESL 217B.

Figure 2C:
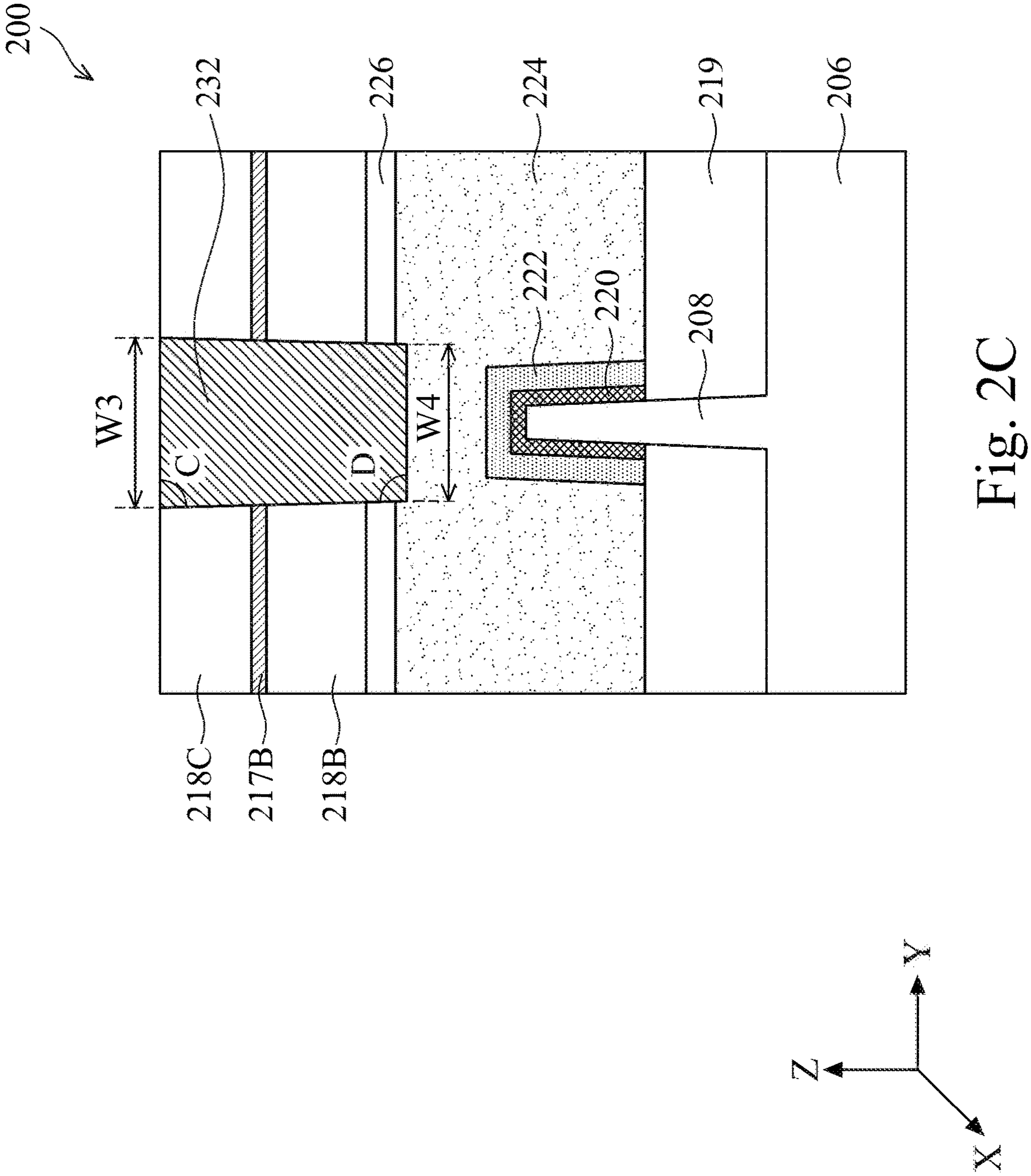
Figure 2D:
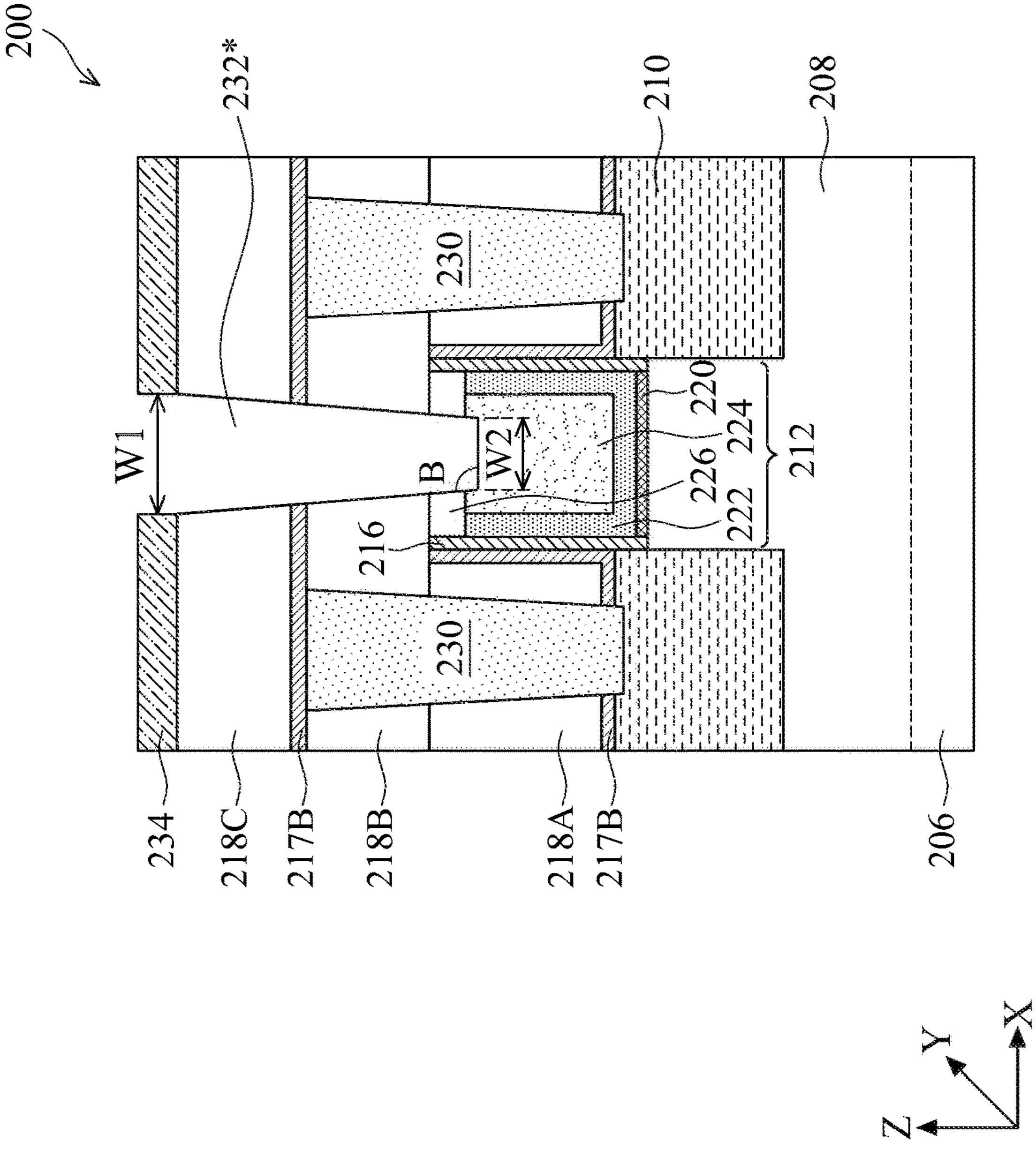
FIGS. 2D-2G illustrate cross-sectional views of a semiconductor device with contact structures at various stages of its fabrication process using an IBE system, in accordance with some embodiments.

Referring to FIGS. 2A-2C, each of gate structures 212 can include an interfacial oxide (IO) layer 220, a high-k (HK) gate dielectric layer 222, a gate metal fill layer 224, and a gate capping layer 226. Gate contact structure 232 can be disposed on gate structure 212 through ILD layers 218B-218A, ESL 217B, and gate capping layer 226. In some embodiments, gate contact structure 232 can have dimensions W3-W4 along a Y-axis greater than dimension W1-W2 along an X-axis. In some embodiments, the ratio of W1:W3 can range from about 1:2 to about 1:4 and the ratio of W2:W4 can range from about 1:2 to about 1:4. Dimensions W1 and W3 are dimensions of the top surface of gate contact structure 232 and dimensions W2 and W4 are dimensions of the base of gate contact structure 232. In some embodiments, dimension W1 can range from about 27 nm to about 33 nm, dimension W2, which is smaller than dimension W2, can range from about 20 nm to about 24 nm, dimension W3 can range from about 50 nm to about 55 nm, and dimension W4, which is equal to or smaller than dimension W4, can range from about 50 nm to about 55 nm.

In some embodiments, such dimensions of gate contact structure 232 can be formed using IBE system 100. The use of IBE system 100 to form gate contact structure 232 with different dimensions along X- and Y-axis can simplify the fabrication of gate contact structure 232 and improve its fabrication process control, as described below. In some embodiments, sidewalls of gate contact structure 232 formed using IBE system 100 can have different angles with the top surface and base of gate contact structure 232 along different planes. For example, the sidewalls of gate contact structure 232 extending along a ZY-plane can form angle A with the top surface and angle B with the base of gate contact structure 232, as shown in FIG. 2B. On the other hand, the sidewalls of gate contact structure 232 extending along a ZX-plane can form angle C with the top surface and angle D with the base of gate contact structure 232, as shown in FIG. 2C. Angle A can be smaller than angle C and angle B can be greater than angle D. As a result, the sidewalls of gate contact structure 232 along a ZX-plane can be more vertical than the sidewalls of gate contact structure 232 along a ZY-plane. That is, the sidewalls of gate contact structure 232 along a ZX-plane can have a greater slope than the sidewalls of gate contact structure 232 along a ZY-plane.

FIGS. 2D-2G illustrate cross-sectional views of FET 200 at various stages of fabricating gate contact structure 232 using IBE system 100, according to some embodiments. The formation of gate contact structure 232 can include sequential operations of forming gate contact openings 232* (shown in FIGS. 2D-2E) and 232 (shown in FIGS. 2F-2G), filling gate contact opening 232 with conductive material, and performing a chemical mechanical polish (CMP) to form the structures of FIGS. 2A-2C.

Figure 2E:
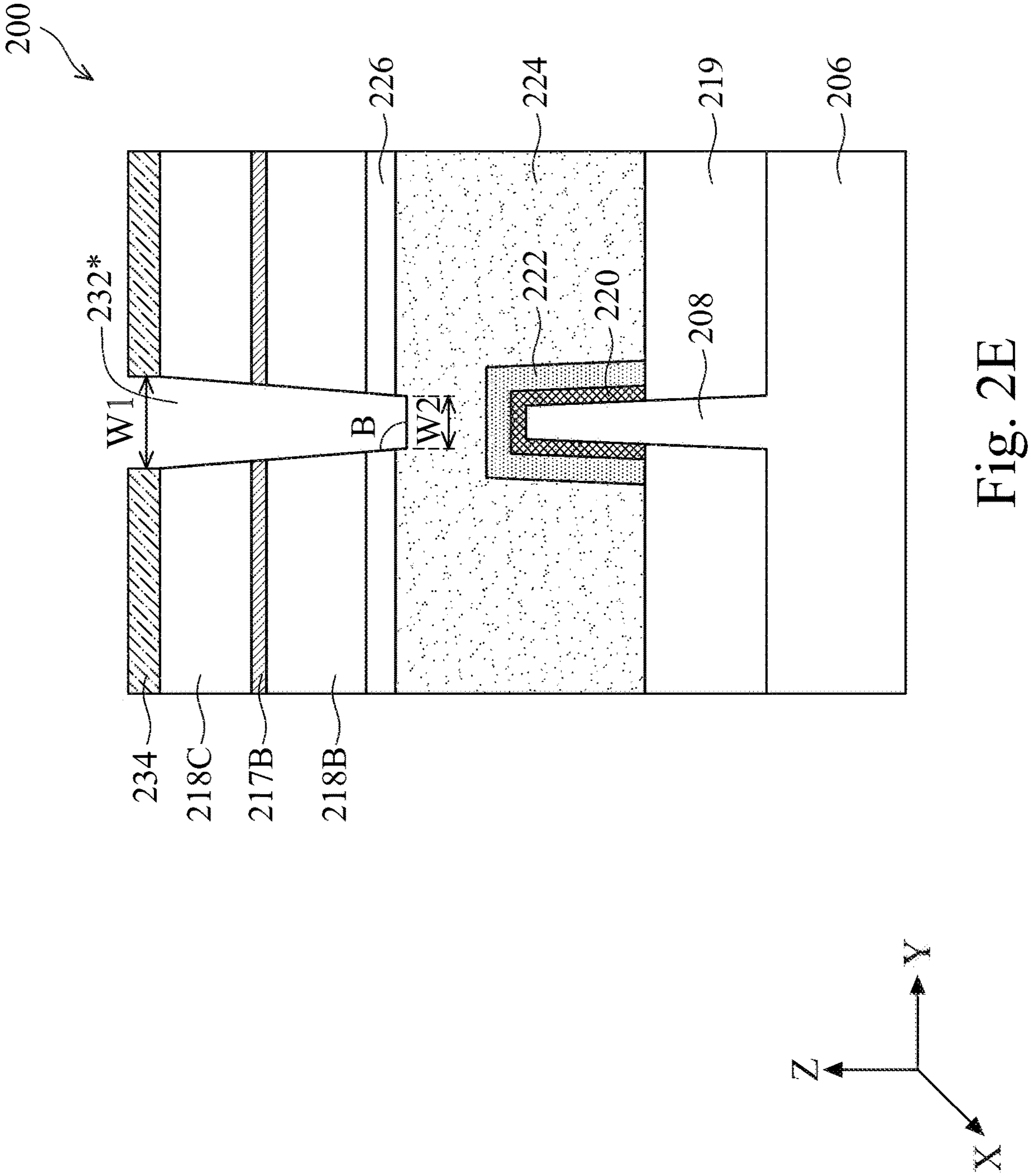
Figure 2F:
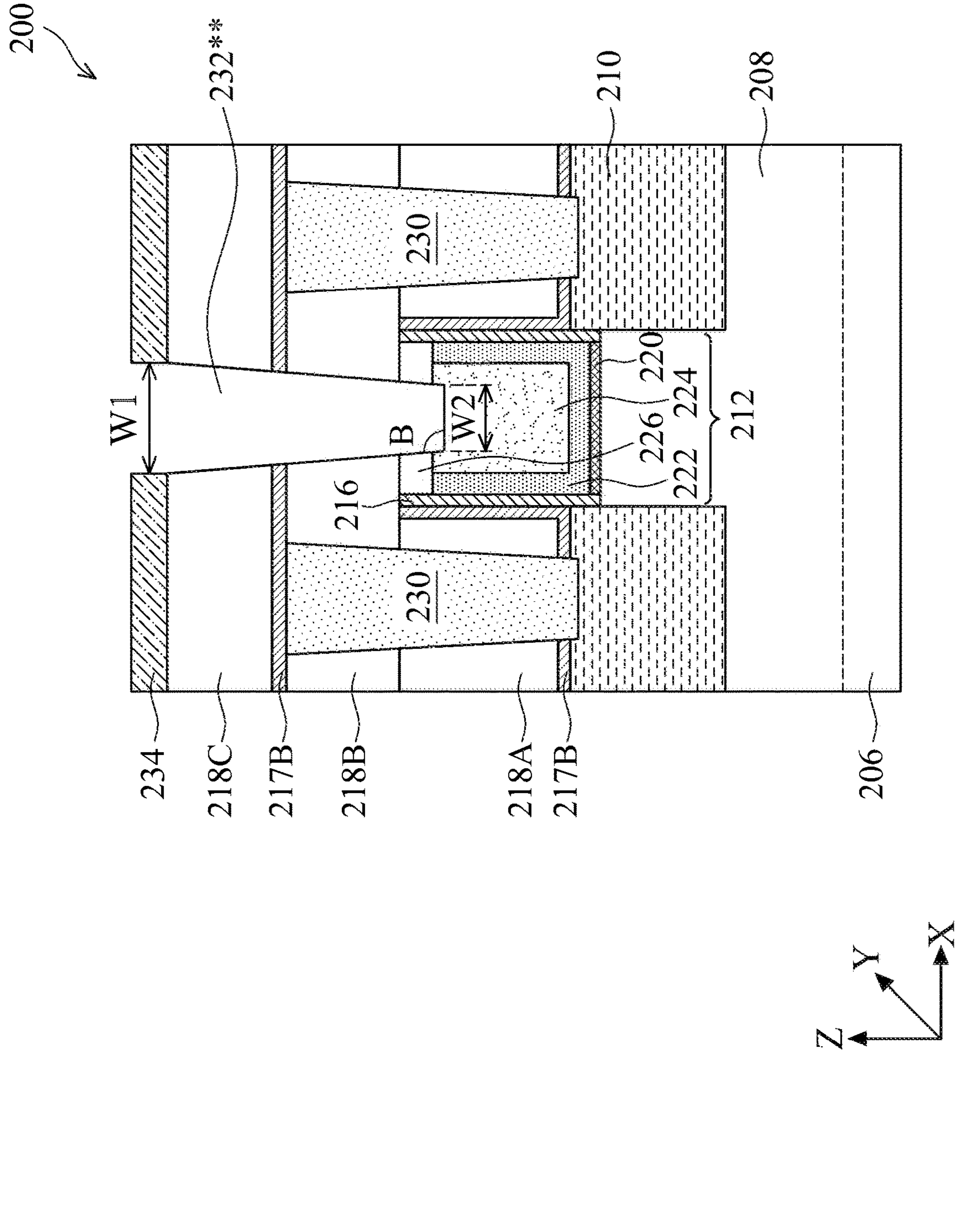

Referring FIGS. 2D-2E, gate contact opening 232* is formed in FET 200 after the formation of S/D contact structures 230. Gate contact opening 232* can be formed on gate metal fill layer 224 by forming a patterned masking layer 234 (e.g., a photoresist layer) on ILD layer 218C using a photolithographic process, which can be followed by etching ILD layers 218B-218C, ESL 217B, and gate capping layer 226 through patterned masking layer 234 to form the structures of FIGS. 2D-2E. Gate contact opening 232* can have similar dimensions W1 and W2 along X- and Y-axes and the sidewalls of gate contact opening 232* can have similar angles B along ZY- and ZX-planes.

Figure 2G:
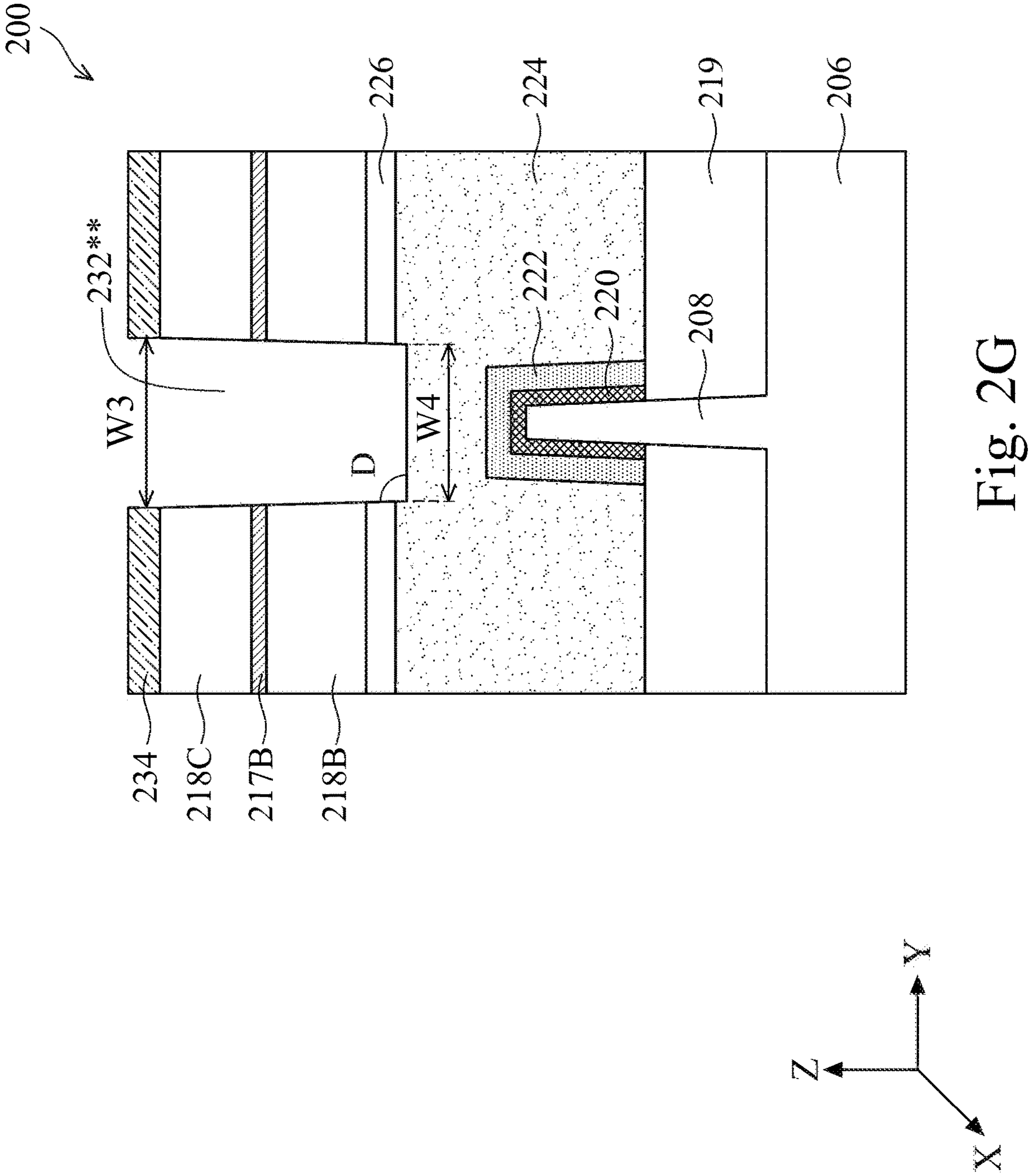

The formation of gate contact opening 232* can be followed by the formation of gate contact opening 232, as shown in FIGS. 2F-2G, using IBE system 100. Gate contact opening 232 can be formed by performing a directional etch process of IBE system 100 on the structures of FIGS. 2D-2E. The directional etch process of IBE system 100 can expand the dimensions of gate contact opening 232* in one direction along a Y-axis (as shown in FIG. 2G) without changing the dimensions of gate contact opening 232* along an X-axis (as shown in FIG. 2F). As a result, dimensions W1 and W2 of gate contact opening 232* along a Y-axis is expanded to respective dimensions W3 and W4 of gate contact opening 232**. In some embodiments, for the directional etch process, the pressure of IBE system 100 can be set in a range from about 0.15 mT to about 0.2 mT, a screen grid voltage of 1.2 KV.

In some embodiments, similar to gate contact structures 232, S/D contact structures 230 can also be formed with different dimensions along X- and Y-axes using IBE system 100.

Figure 2H:
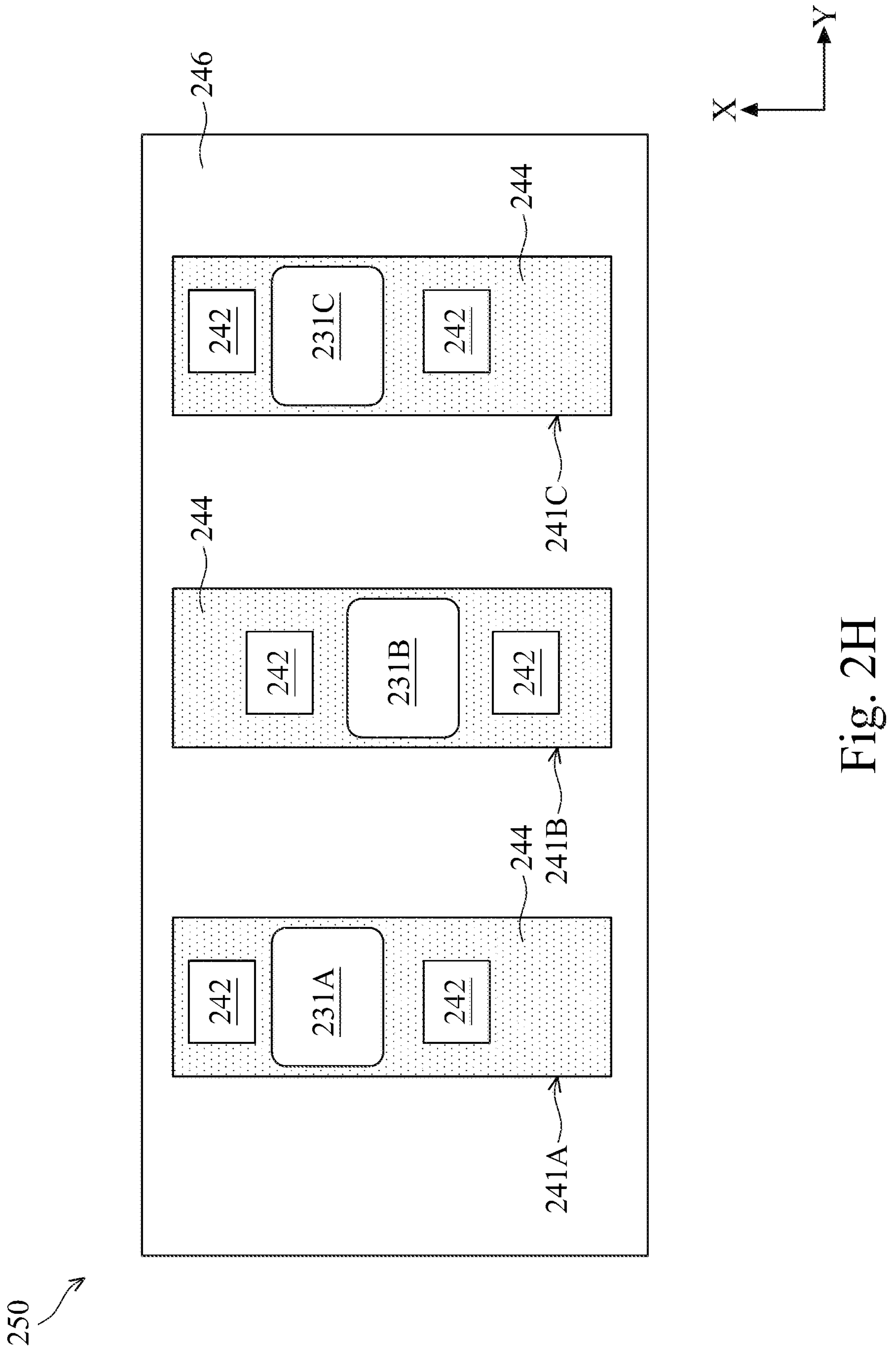
FIGS. 2H-2J illustrate top views of a semiconductor device with contact structures formed using an IBE system, in accordance with some embodiments.
Figure 2I:
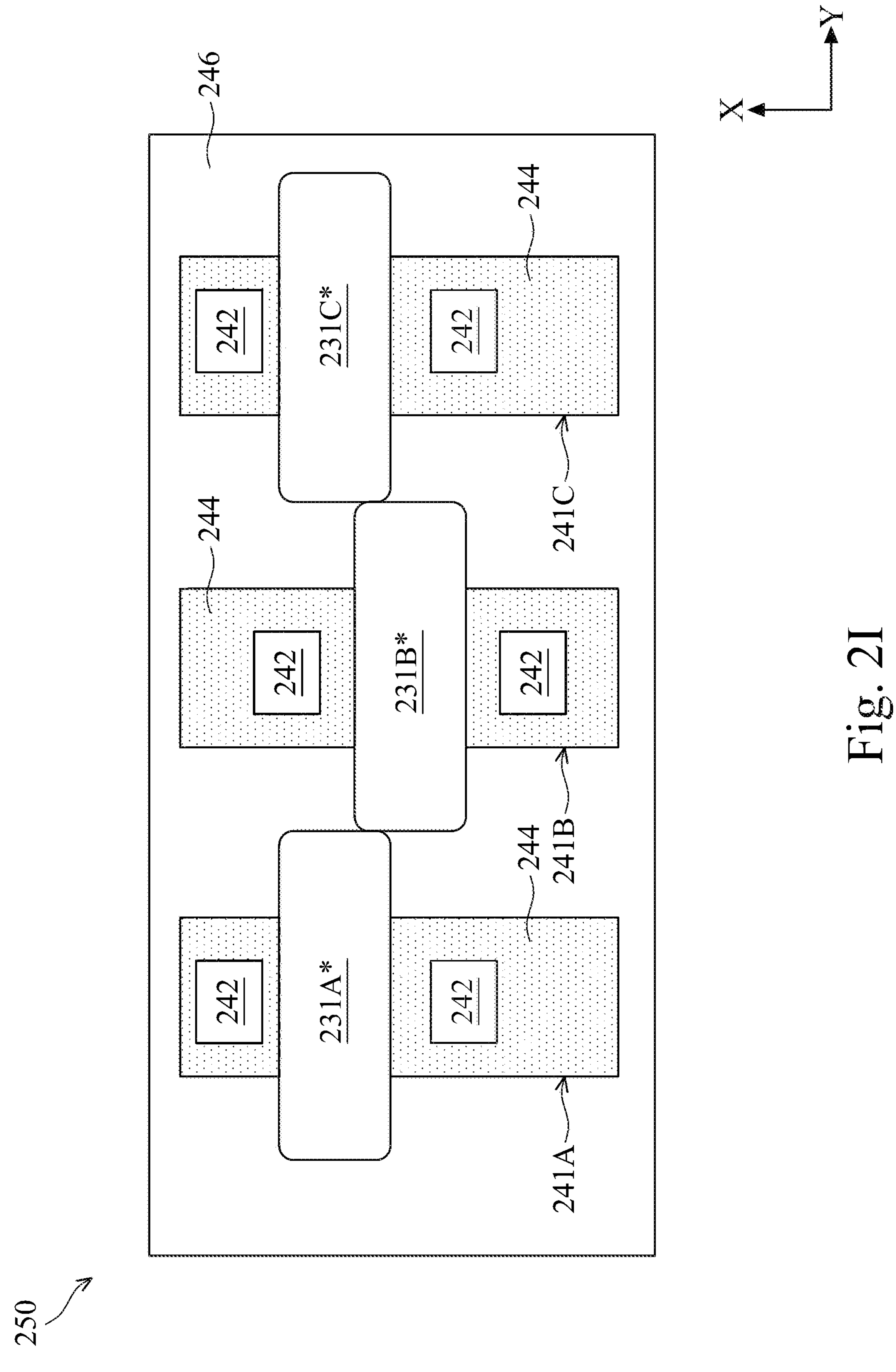
Figure 2J:
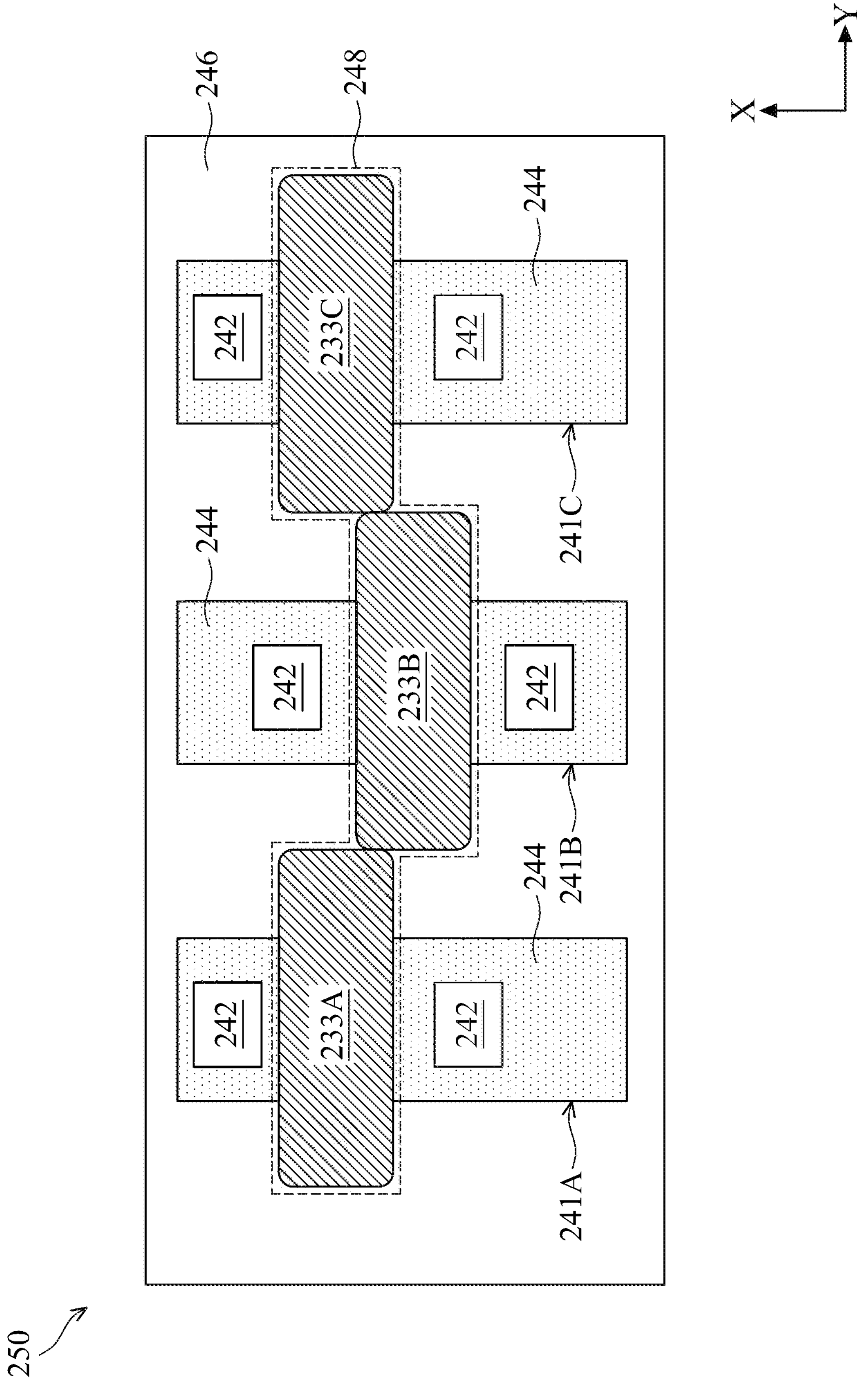

FIGS. 2H-2I illustrate top views of directional etching to form merged gate contact structure 248 of parallel FETs 241A-241C of semiconductor device 250 using IBE system 100. Each of FETs 241A-241C can be similar to FET 200. Merged gate contact structure 248 (shown in FIG. 2J) can be formed by connecting gate contact structures 233A-233C of respective FETs 241A-241C. Each of gate contact structures 233A-233C can have dimension W1 along an X-axis and dimension W3 along a Y-axis, similar to gate contact structure 232.

FIG. 2H illustrates a top view of semiconductor device 250 with parallel FETs 241A-241C after the formation of gate contact openings 231A-231C, similar to gate contact opening 232*. For simplicity, S/D contact structures 242 and gate contact openings 231A-231C are shown on active layers 242 of FETs 241A-241C. FETs 241A-241C can be separated from each other by IDL layer 246. FIG. 2I illustrates a top view of semiconductor device 250 after the formation of gate contact openings 231A*-231C* using IBE system 100, similar to gate contact opening 232. Gate contact openings 231**A*-231C* can have dimensions similar to gate contact opening 232. The formation of gate contact openings 231**A*-231C* can be followed by filling the gate contact openings 231A*-231C* with conductive material to form the merged gate contact structure 248 of FIG. 2J.

Figure 3:
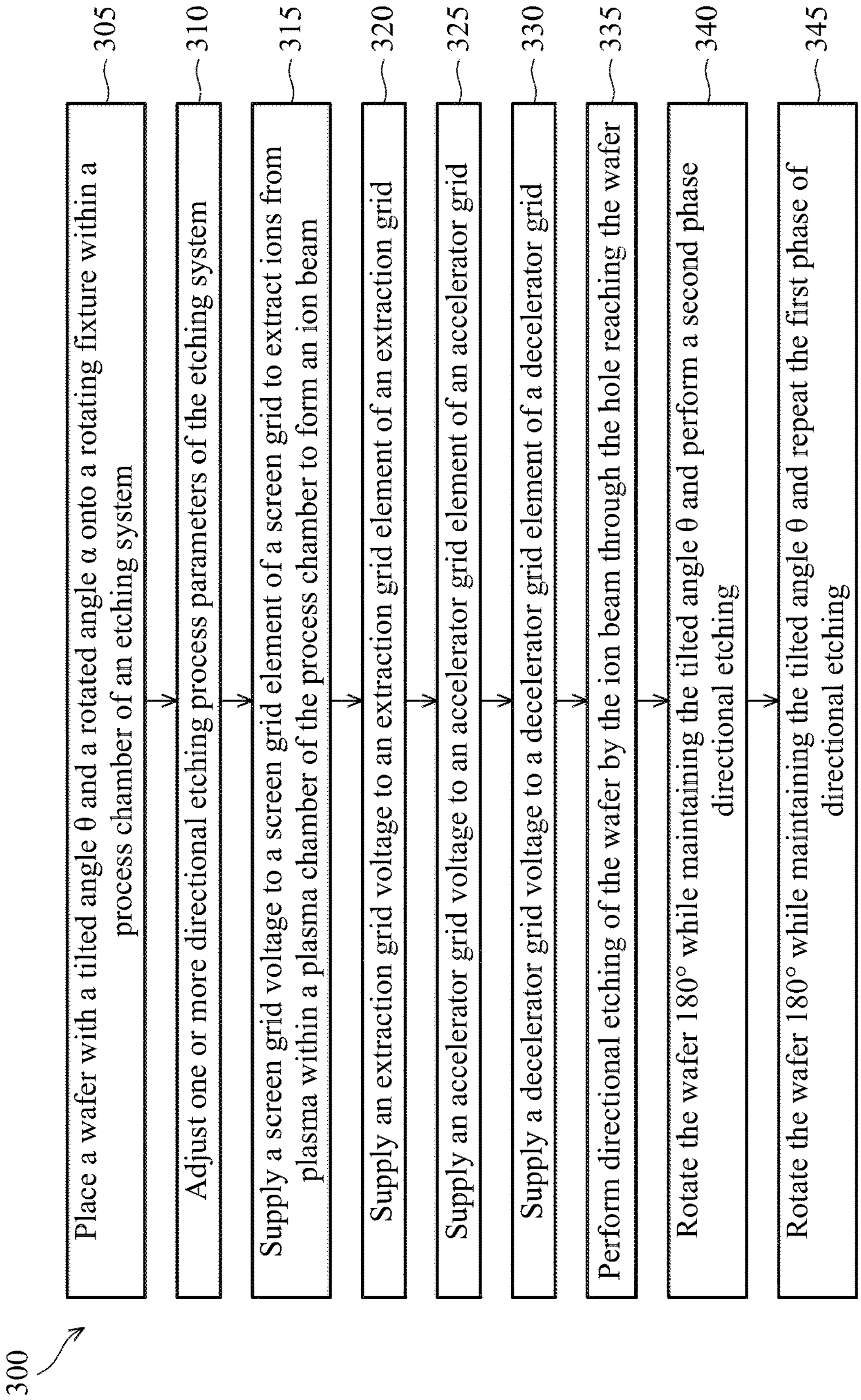
FIG. 3 is a flow chart of a method for performing directional etching using an IBE system with four or five grids, in accordance with some embodiments.

FIG. 3 is a flow chart of a method 300 for performing directional etching using an IBE system with four or five grids, in accordance with some embodiments. This disclosure is not limited to this operational description. Rather, other operations are within the spirit and scope of the present disclosure. It is to be appreciated that additional operations can be performed. Moreover, not all operations may be needed to perform the disclosure provided herein. Further, some of the operations can be performed simultaneously, or in a different order than shown in FIG. 3. In some implementations, one or more other operations can be performed in addition to or in place of the presently described operations. For illustrative purposes, method 300 is described with reference to the embodiments of FIG. 1A-1J, or 2A-2J. However, method 300 is not limited to these embodiments.

In some embodiments, to perform directional etching, wafer 154 is placed on a rotating fixture 107 in process chamber 101, which can be a vacuum chamber. A gas is introduced through inlet 102. The pressure of process chamber 101 can be reduced in a range from about 0.15 mT to about 0.2 mT. An RF plasma generator can be turned on and a plasma is struck (ignited) within plasma chamber 103. Ions are extracted by screen grid 110, and further accelerated by accelerator grid 120 as they move toward the wafer to form ion beams, such as ion beam 141, ion beam 142, and ion beam 143. The direction of ion beam 141, ion beam 142, ion beam 143 can be controlled by the a voltage difference between the first deflector voltage supplied to deflector plate 135 and the second deflector voltage supplied to deflector plate 136, or a voltage difference between the first deflector voltage supplied to deflector plate 138 and the second deflector voltage supplied to deflector plate 139. Ions in the ion beams hit wafer 154, sputtering materials from the surface. The process continues until pattern is etched exposing the underlying layer for wafer 154. The high level description of the process is described below in more details in various operations.

In operation 305 of FIG. 3, a wafer is placed onto a rotating fixture within a process chamber of an etching system, where the wafer has a tilted angle θ and a rotated angle of a. For example, as shown and discussed with reference to FIG. 1A, wafer 154 is placed onto rotating fixture 107 within process chamber 101 of IBE system 100, where wafer 154 has a tilted angle θ and a rotated angle of α.

In operation 310 of FIG. 3, directional etching process parameters of the etching system are adjusted. For example, as shown and discussed with reference to FIG. 1A, directional etching process parameters of IBE system 100 are adjusted to have an operation pressure between about 0.15 mT to about 0.20 mT for the process chamber, and the tilted angle θ between about 5° and 60° degrees. In addition, in some embodiments, an etching chemical can be supplied to plasma chamber 103.

In operation 315 of FIG. 3, a screen grid voltage is supplied to a screen grid element of a screen grid to extract ions from plasma within a plasma chamber of the process chamber to form an ion beam. For example, as shown and discussed with reference to FIG. 1B, screen grid voltage 124 is supplied to screen grid element 111 of screen grid 110 to extract ions from plasma within plasma chamber 103 within process chamber 101 to form ion beam 141.

In operation 320 of FIG. 3, an extraction grid voltage is supplied to an extraction grid element of an extraction grid. For example, as shown and discussed with reference to FIG. 1B, extraction grid voltage 125 is supplied to extraction grid element 116 of extraction grid 115. A voltage difference between screen grid voltage 124 and extraction grid voltage 125 determines an ion current density of ion beam 141.

In operation 325 of FIG. 3, an accelerator grid voltage is supplied to an accelerator grid element of an accelerator grid. For example, as shown and discussed with reference to FIG. 1B, accelerator grid voltage 126 is supplied to accelerator grid element 121 of accelerator grid 120. A voltage difference between extraction grid voltage 125 and accelerator grid voltage 126 can determine an ion beam energy for ion beam 141.

In operation 330 of FIG. 3, a decelerator grid voltage is supplied to a decelerator grid element of a decelerator grid. For example, as shown and discussed with reference to FIG. 1B, decelerator grid voltage 127 is supplied to decelerator grid element 131 of decelerator grid 130. In some embodiments, decelerator grid voltage 127 can be the ground voltage.

In operation 335 of FIG. 3, directional etching of the wafer is performed by the ion beam through the hole reaching the wafer. For example, as shown and discussed with reference to FIG. 1B, directional etching of wafer 154 is performed by ion beam 141 through hole 151 reaching wafer 154. Operations performed during operation 335 can be viewed as a first phase of directional etching.

In operation 340 of FIG. 3, the wafer is rotated 180° to have a rotated angle of 180°+α degree while maintaining the tilted angle θ, and a second phase directional etching is performed on the wafer by the ion beams. For example, as shown and discussed with reference to FIG. 1A, wafer 154 is rotated 180° to have a rotated angle of 180°+α degree while maintaining the tilted angle θ. Moreover, a second phase directional etching is performed on wafer 154 by the ion beams, such as ion beam 141, ion beam 142, and ion beam 143.

In operation 345 of FIG. 3, the wafer is rotated 180° to have the rotated angle of α degree while maintaining the tilted angle θ, and the first phase of directional etching on the wafer is repeated. For example, as shown and discussed with reference to FIG. 1B, wafer 154 is rotated 180° to have the rotated angle of α degree while maintaining the tilted angle θ, and the first phase of directional etching on wafer 154 is repeated.

The present disclosure provides example IBE systems (e.g., IBE system 100) having a grid system with four grids or five grids (e.g., grid system 150) for directional etching to prevent and/or mitigate the asymmetry etching behavior. An IBE system with the example grid system can generate improved or close to uniformly distributed etching across different locations of a surface of a wafer within the process chamber of the IBE system. The IBE system includes a plasma chamber configured to provide plasma, a screen grid, an extraction grid, an accelerator grid, and a decelerator grid. The screen grid includes a screen grid element in contact with the plasma chamber. The extraction grid includes an extraction grid element disposed adjacent to and separated from the screen grid element. The accelerator grid includes an accelerator grid element disposed adjacent to and separated from the extraction grid element. The decelerator grid includes a decelerator grid element disposed adjacent to and separated from the accelerator grid element. The screen grid element, the extraction grid element, the accelerator grid element, and the decelerator grid element form a hole that extends through the screen grid, the extraction grid, the accelerator grid, and the decelerator grid. The screen grid receives a screen grid voltage to extract ions from the plasma within the plasma chamber to form an ion beam through the hole. The extraction grid receives an extraction grid voltage, where an ion current density of the ion beam through the hole depends on a voltage difference between the screen grid voltage and the extraction grid voltage. The accelerator grid receives an accelerator grid voltage. An ion beam energy for the ion beam through the hole depends on a voltage difference between the extraction grid voltage and the accelerator grid voltage. The decelerator grid receives a decelerator grid voltage.

In some embodiments, an IBE system includes a process chamber. The process chamber includes a plasma chamber configured to provide plasma. In addition, the process chamber includes a screen grid, an extraction grid, an accelerator grid, a decelerator grid, a hole that extends through the screen grid, the extraction grid, the accelerator grid, and the decelerator grid, and a deflector system includes at least a first deflector plate and a second deflector plate separated by a gap. The screen grid includes a screen grid element in contact with the plasma chamber. The extraction grid includes an extraction grid element disposed adjacent to and separated from the screen grid element. The accelerator grid includes an accelerator grid element disposed adjacent to and separated from the extraction grid element. The decelerator grid includes a decelerator grid element disposed adjacent to and separated from the accelerator grid element. The screen grid element, the extraction grid element, the accelerator grid element, and the decelerator grid element form a hole that extends through the screen grid, the extraction grid, the accelerator grid, and the decelerator grid. The first deflector plate and the second deflector plate are disposed around the hole. The first deflector plate is configured to receive a first deflector voltage, and the second deflector plate is configured to receive a second deflector voltage. A trajectory of an ion beam through the hole formed by ions extracted from the plasma within the plasma chamber depends on a voltage difference between the first deflector voltage and the second deflector voltage.

In some embodiments, a method for directional etching by an IBE system includes placing a wafer onto a rotating fixture within a process chamber of the IBE system, where the wafer has a tilted angle θ and a rotated angle of α. In addition, the method includes supplying a screen grid voltage to a screen grid element of a screen grid to extract ions from plasma within a plasma chamber of the process chamber to form an ion beam. The method further includes supplying an extraction grid voltage to an extraction grid element of an extraction grid, where an ion current density of the ion beam depends on a voltage difference between the screen grid voltage and the extraction grid voltage. Moreover, the method includes supplying an accelerator grid voltage to an accelerator grid element of an accelerator grid, where an ion beam energy for the ion beam depends on a voltage difference between the extraction grid voltage and the accelerator grid voltage. Furthermore, the method includes supplying a decelerator grid voltage to a decelerator grid element of a decelerator grid. The screen grid element, the extraction grid element, the accelerator grid element, and the decelerator grid element form a hole that extends through the screen grid, the extraction grid, the accelerator grid, and the decelerator grid. Afterward, the method includes performing directional etching of the wafer by the ion beam through the hole reaching the wafer.

The foregoing disclosure outlines features of several embodiments so that those skilled in the art can better understand the aspects of the present disclosure. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they can make various changes, substitutions, and alterations herein without departing from the spirit and scope of the present disclosure.

What is claimed is:

1. An etching system, comprising:

a screen grid comprising a screen grid element, wherein the screen grid is configured to receive a screen grid voltage to extract ions from a plasma within a plasma chamber to form an ion beam;

an extraction grid comprising an extraction grid element disposed adjacent to the screen grid, wherein the extraction grid is configured to receive an extraction grid voltage;

an accelerator grid comprising an accelerator grid element disposed adjacent to the extraction grid, wherein the accelerator grid is configured to receive an accelerator grid voltage;

a decelerator grid comprising a decelerator grid element disposed adjacent to the accelerator grid, wherein the decelerator grid is configured to receive a decelerator grid voltage;

a controller configured to supply the screen grid voltage and the extraction grid voltage;

a grid opening extending through the screen grid, the extraction grid, the accelerator grid, and the decelerator grid; and a pair of deflector plates configured to control a trajectory of the ion beam through the grid opening.

2. The etching system of claim 1, further comprising a deflector plate disposed between the extraction grid and the accelerator grid.

3. The etching system of claim 1, further comprising a deflector plate disposed adjacent to the decelerator grid.

4. The etching system of claim 1, further comprising a deflector plate with an elongated side substantially perpendicular to elongated sides of the screen grid element, the extraction grid element, the accelerator grid element, and the decelerator grid element.

5. The etching system of claim 1, further comprising first and second deflector plates, wherein a first opening between the first and second deflector plates is aligned with a second opening extending through the screen grid and the extraction grid.

6. The etching system of claim 1, further comprising first and second adjustable deflector plates disposed between the extraction grid and the accelerator grid, wherein the first and second adjustable deflector plates are configured to shift along a vertical direction and a horizontal direction.

7. The etching system of claim 1, wherein a first distance between the screen grid and the extraction grid is less than a second distance between the extraction grid and the accelerator grid.

8. The etching system of claim 1, wherein a first distance between the extraction grid and the accelerator grid is greater than a second distance between the accelerator grid and the decelerator grid.

9. The etching system of claim 1, wherein the accelerator grid voltage is a negative voltage with respect to the decelerator grid voltage.

10. The etching system of claim 1, wherein the screen grid voltage and the extraction grid voltage are positive voltages with respect to the decelerator grid voltage.

11. An etching system, comprising:

a screen grid;

an extraction grid disposed adjacent to the screen grid;

an accelerator grid disposed adjacent to the extraction grid;

a decelerator grid disposed adjacent to the accelerator grid;

a grid opening extending through the screen grid, the extraction grid, the accelerator grid, and the decelerator grid;

a first deflector plate disposed between the extraction grid and the accelerator grid;

a second deflector plate disposed below the first deflector plate; and a plate opening between the first and second deflector plates aligned with the grid opening.

12. The etching system of claim 11, wherein the first and second deflector plates are adjustable along a vertical direction and a horizontal direction.

13. The etching system of claim 11, wherein the first and second deflector plates are configured to receive first and second voltages, respectively, and wherein a polarity of the first voltage is opposite to a polarity of the second voltage.

14. The etching system of claim 11, wherein the plate opening is wider than the grid opening.

15. The etching system of claim 11, further comprising third and fourth deflector plates disposed between the extraction grid and the accelerator grid.

16. The etching system of claim 15, further comprising:

an other plate opening between the third and fourth deflector plates; and an other grid opening extending through the screen grid, the extraction grid, the accelerator grid, and the decelerator grid, wherein the other plate opening is aligned with the other grid opening.

17. A method, comprising:

generating an ion beam through a grid opening extending through a screen grid, an extraction grid, an accelerator grid, and a decelerator grid in a process chamber;

controlling a first voltage supply to the screen grid in contact with a plasma chamber in the process chamber;

controlling a second voltage supply to the extraction grid adjacent to the screen grid;

controlling a third voltage supply to the accelerator grid adjacent to the extraction grid;

controlling a fourth voltage supply to the decelerator grid adjacent to the accelerator grid;

aligning an opening between a pair of deflector plates with the grid opening; and performing a directional etching of a wafer by the ion beam.

18. The method of claim 17, wherein aligning the opening between the pair of deflector plates comprises:

placing the pair of deflector plates between the extraction grid and the accelerator grid; and moving the pair of deflector plates to adjust the opening between the pair of deflector plates.

19. The method of claim 17, further comprising controlling voltages of a pair of deflector plates disposed between the extraction grid and the accelerator grid to control a trajectory of the ion beam through the grid opening.

20. The method of claim 17, further comprising placing the wafer at a tilted angle on a rotating fixture in the process chamber.

* * * * *